United States Patent
Bemanian et al.

(10) Patent No.: US 9,053,951 B2
(45) Date of Patent: Jun. 9, 2015

(54) MASSIVELY PARALLEL INTERCONNECT FABRIC FOR COMPLEX SEMICONDUCTOR DEVICES

(76) Inventors: Majid Bemanian, Pleasanton, CA (US); Farhang Yazdani, Bellevue, WA (US)

( * ) Notice: Subject to any disclaimer, the term of this patent is extended or adjusted under 35 U.S.C. 154(b) by 0 days.

(21) Appl. No.: 13/329,266

(22) Filed: Dec. 17, 2011

(65) Prior Publication Data

US 2012/0086050 A1 Apr. 12, 2012

Related U.S. Application Data

(63) Continuation of application No. 12/436,235, filed on May 6, 2009, now Pat. No. 8,390,035.

(51) Int. Cl.
*H01L 23/52* (2006.01)
*H01L 25/065* (2006.01)
*H01L 23/00* (2006.01)
*H01L 25/18* (2006.01)
*H01L 23/13* (2006.01)
*H01L 23/525* (2006.01)

(52) U.S. Cl.
CPC .............. H01L 25/0657 (2013.01); *H01L 23/13* (2013.01); *H01L 23/525* (2013.01); H01L 24/14 (2013.01); *H01L 24/16* (2013.01); *H01L 24/48* (2013.01); H01L 25/0652 (2013.01); H01L 25/0655 (2013.01); H01L 25/18 (2013.01); *H01L 2223/6677* (2013.01); *H01L 2224/13099* (2013.01); *H01L 2224/16227* (2013.01); *H01L 2224/48145* (2013.01); *H01L 2224/48227* (2013.01); *H01L 2225/06513* (2013.01); *H01L 2225/06517* (2013.01); *H01L 2225/0652* (2013.01); *H01L 2225/06527* (2013.01); *H01L 2225/06541* (2013.01); *H01L 2225/06572* (2013.01); *H01L 2225/06589* (2013.01); *H01L 2924/01029* (2013.01); *H01L 2924/01058* (2013.01); *H01L 2924/01079* (2013.01); *H01L 2924/01082* (2013.01); *H01L 2924/10329* (2013.01); *H01L 2924/15321* (2013.01); *H01L 2924/15331* (2013.01); *H01L 2924/01005* (2013.01); *H01L 2924/01006* (2013.01); *H01L 2924/01019* (2013.01); *H01L 2924/01033* (2013.01); *H01L 2924/01075* (2013.01); *H01L 2924/01087* (2013.01); *H01L 2924/014* (2013.01); *H01L 2924/3511* (2013.01); *H01L 2224/16225* (2013.01); *H01L 2924/30107* (2013.01)

(58) Field of Classification Search
CPC ................. H01L 25/0657; H01L 27/11807; H01L 2924/00; H01L 2225/48227
USPC ................. 257/209, 777; 361/56; 326/38
See application file for complete search history.

(56) References Cited

U.S. PATENT DOCUMENTS

| | | | | |
|---|---|---|---|---|
| 6,150,724 A * | 11/2000 | Wenzel et al. | ................. | 257/777 |
| 6,204,562 B1 * | 3/2001 | Ho et al. | ................. | 257/777 |
| 6,452,259 B2 * | 9/2002 | Akiyama | ................. | 257/686 |
| 2003/0146517 A1 * | 8/2003 | Lasky et al. | ................. | 257/777 |
| 2008/0080111 A1 * | 4/2008 | Lin et al. | ................. | 361/56 |
| 2008/0309370 A1 * | 12/2008 | Spangaro | ................. | 326/38 |

* cited by examiner

*Primary Examiner* — Eugene Lee
*Assistant Examiner* — Fang-Xing Jiang
(74) *Attorney, Agent, or Firm* — Maxvalueip LLC

(57) ABSTRACT

An embodiment of this invention uses a massive parallel interconnect fabric (MPIF) at the flipped interface of a core die substrate (having the core logic blocks) and a context die (used for in circuit programming/context/customization of the core die substrate), to produce ASIC-like density and FPGA-like flexibility/programmability, while reducing the time and cost for development and going from prototyping to production, reducing cost per die, reducing or eliminating NRE, and increasing performance. Other embodiments of this invention enable debugging complex SoC through large contact points provided through the MPIF, provide for multi-platform functionality, and enable incorporating FGPA core in ASIC platform through the MPIF.

18 Claims, 27 Drawing Sheets

PRIOR ART

MASSIVELY PARALLEL INTERCONNECT FABRIC FOR COMPLEX SEMICONDUCTOR DEVICES

RELATED APPLICATIONS

This application is a Continuation of Ser. No. 12/436,235, filed May 6, 2009, now U.S. Pat. No. 8,390,035. It claims the benefit of the priority date of Ser. No. 12/436,235. It also incorporates by reference all the teachings of Ser. No. 12/436, 235.

BACKGROUND OF THE INVENTION

Two prevalent approaches for building complex custom semiconductor devices are based on field-programmable gate array (FPGA) or application-specific integrated circuit (ASIC).

A FPGA is a semiconductor device that can be configured by the customer or designer after manufacturing, using a logic circuit diagram or a source code in a hardware description language (HDL) describing how the chip functions. FPGAs contain programmable logic components (logic blocks), and a hierarchy of reconfigurable interconnects that allow the blocks to be wired together. Logic blocks can be configured to perform complex combinational functions as well as simple logic gates through combinational logic and/or lookup table (s). In FPGAs, the logic blocks may include memory elements in form of simple flip-flops or even more complete blocks of memory.

An ASIC is an integrated circuit (IC) customized for a particular use, rather than intended for general-purpose use. The complexity/functionality of ASIC has grown significantly. Typically, an ASIC may contain few hundred to over 100 million gates. A System-on-a-chip (SoC) type ASICs may include processors, memory blocks (e.g., ROM, RAM, and Flash) and other large building blocks. An HDL, such as Verilog or VHDL, is used to describe the functionality of ASICs during the design phase. There have been several approaches to design and implement ASIC devices, such as gate array (requiring customization at the metallization layers), standard cell, full custom design, and structured/platform design. In structured ASIC approach, the ASIC vendor typically predefines the logic mask-layers of a device; however, the customization is done by creating custom metal layers to create custom connections between predefined lower-layer logic elements. Structured ASIC approach fits between FPGAs and Standard-Cell ASIC designs. Because only a small number of chip layers must be custom-produced, "structured ASIC" designs have much smaller non-recurring expenditures (NRE) than "standard-cell" or "full-custom" chips, which require that a full mask set be produced for every design.

An advantage of FPGA over ASIC is that FPGA can be used to implement any logical function that an ASIC could perform, but offers the ability to update the functionality after shipping. However, the tradeoff is the larger die size, more power consumption, less performance, and higher per die cost (not including NRE).

FPGAs are the modern-day technology for building a breadboard or prototype from standard parts; programmable logic blocks and programmable interconnects allow the same FPGA to be used in many different applications. For smaller designs and/or lower production volumes, FPGAs may be more cost effective than an ASIC design even in production. The non-recurring engineering cost of an ASIC can run into the millions of dollars.

The many programmable interconnects and associated storage elements in FPGA on the same die as its logical blocks require large die size and high power consumption, making FPGA not a viable option for production for certain applications requiring low power consumption or low cost per die.

SUMMARY OF THE INVENTION

In an embodiment of this invention, a core staking of a die is done by flipping (via a flip-chip technology) a programming/context die on a core IC/die substrate having logic blocks, to electrically connect the logic blocks through a massive parallel interconnect fabric (MPIF) formed by direct pad-pad signal (and/or power) connection at the flipped interface. The examples of types of pad-pad connections include metal-metal, conducting polymer to conducting polymer, and conducting semiconductor to conducting semiconductor. The MPIF allows for connectivity at transistor/gate level on the core die substrate to the context die, leading to high density, high performance, and low cost (NRE and Unit Price) programmable platform ASIC. This approach reduces the cost of development, physical design (PD), and manufacturing. In addition, the time/cost of conversion to full production is reduced with having limited or no system level re-qualification.

An embodiment of this invention incorporates rich IP (e.g., SerDes, processors, memory(s)) in application oriented structured ASIC and high performance multi-function platform e.g., for consumer, storage, and telecom/wireless markets.

In an embodiment of this invention, system on chip (SOC) macro blocks are separated and used as building blocks for SOC construction via MPIF, with e.g., processors (general and custom), memory, analog functions, specialty I/O, digital signal processing (DSP). The decoupling of core and context of SOC architecture and implementation, in an embodiment of this invention, reduces the cost of IC development drastically, due to reduction of integration of the building blocks (context), reduction in associated resources and skill set for coding (R&D), verification, and test. In one embodiment, the production cost is reduced, for example, due to increase in overall yield.

In one embodiment, the area, power consumption is reduced due to core stacking at the gate level through MPIF. In one embodiment, the performance is increased compared to FPGA, due to reduction in delays or parasitic.

In an embodiment of this invention, the in-circuit programming functions are separated from the system logic to reduce the overhead associated with area and power consumption. For example, in the case of FPGA, since the interconnects and storage elements are separated from the core LE (logic elements), it results in production parts with less area and power consumption on the core die substrate.

In one embodiment, mixed technology MPIF is used to leverage existing building blocks and avoid costly porting of technology.

In one embodiment, a full-chip debug and trace capability is enabled without the huge and costly overhead.

DETAILED DESCRIPTION OF THE PREFERRED EMBODIMENTS

Flip-chip or wire bonding techniques are commonly used in semiconductor packaging of semiconductor devices (on die) to package substrate. However, these techniques are typically used at SOC/chip/I/O level (i.e., higher hierarchical interconnect level) given the size and other physical and design requirements/constraints, instead of gate/logic block level (i.e., lower hierarchical interconnect level). In such an interconnect hierarchy, the inter-gate level connections tend to be localized at micro level; inter-micro level connections tend to be localized at macro level; and the inter-macro level connections tend to be localized at chip/SOC level. Therefore, even though there may be millions of gate level connections, e.g., in a SOC, there are much fewer chip-chip interconnects.

Figure 1A:
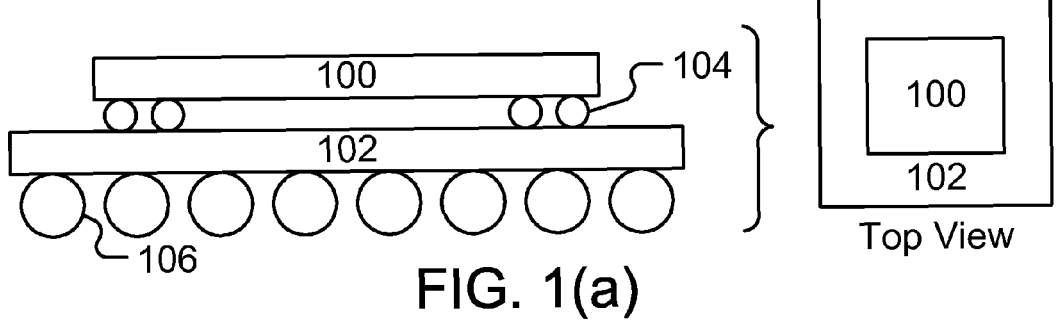
FIG. 1(a) depicts electrically connecting a die on a package substrate using bumps, as in prior art.

For example, FIG. 1(a) illustrates a prior art the flip-chip placement of a die (100) on a package substrate (102) using die bumps (104) placed on the die for electrical connection between the die and the package substrate. The electrical connection to the package substrate from the outside is provided via the package balls (106). Typically, the empty space between the die (100) and the package substrate (102) is filled by an underfill dielectric material, joining and locking the die to the package substrate, protecting the bumps from moisture or other environmental hazards, providing additional mechanical strength to the assembly, as well as compensating for any thermal expansion difference between the die chip and the package substrate. Flip-chip provides the direct connection from die pad to package substrate, with capability of, for example, about few hundred to about few thousands (e.g., less than 4000 to 6000) I/O through die bumps. However, the process requires an additional wafer-level processing (bumping) and it may require wafer-level redistribution routing. Such processing may result in a very expensive substrate (e.g., with 14 layers). In many situations, the package cost becomes more than the device cost.

Figure 1B:
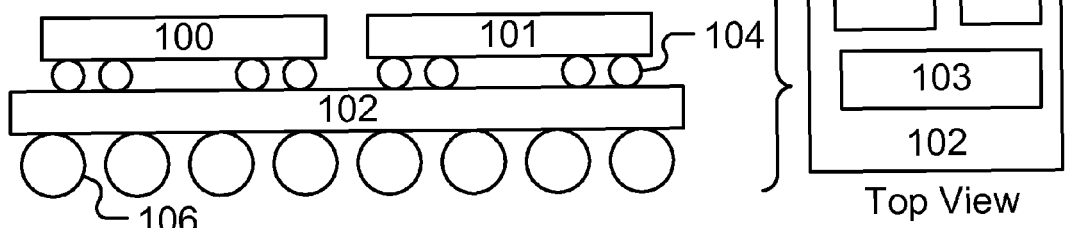
FIG. 1(b) depicts electrically connecting multiple dice to a package substrate using bumps, as in prior art.
Figure 1C:
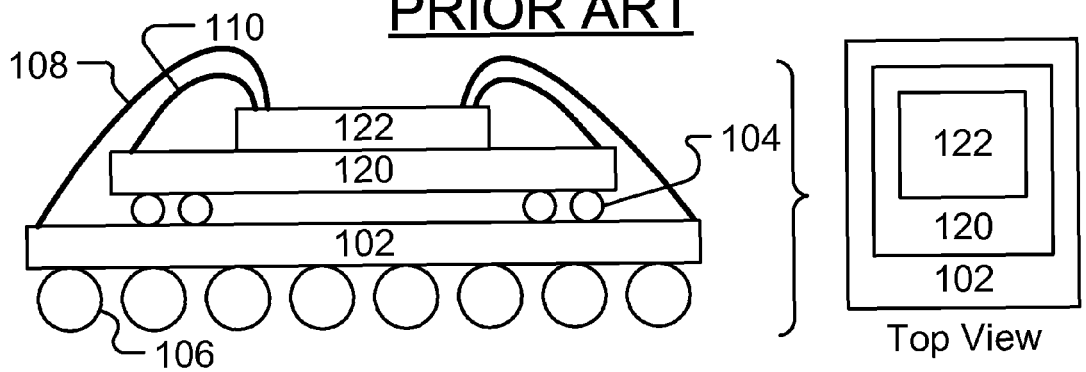
FIG. 1(c) depicts electrically connecting dice to a package substrate using bumps and wire bonds, as in prior art.

In prior art, the flip-chip technique has also been applied to multiple chips/dice. As illustrated in FIG. 1(b), the chips (100, 101, and 103) are flipped and electrically connected to the package substrate via the bumps (104). FIG. 1(c) illustrates both wire bonding and flip-chip for connecting the chips (122 and 120) to the package substrate, as in prior art. For example, wire bonds 108 and 119 electrically connect the top die (122) to the package substrate (102) and the supporting die (120), respectively. Wire-bond technology can support relatively low number (e.g., 1000) I/O with about 50 μm pitch. In comparison, flip-chip allows for more connections through die bumps, less inductance (compared with wire bond), and higher performing and denser circuits.

Figure 1D:
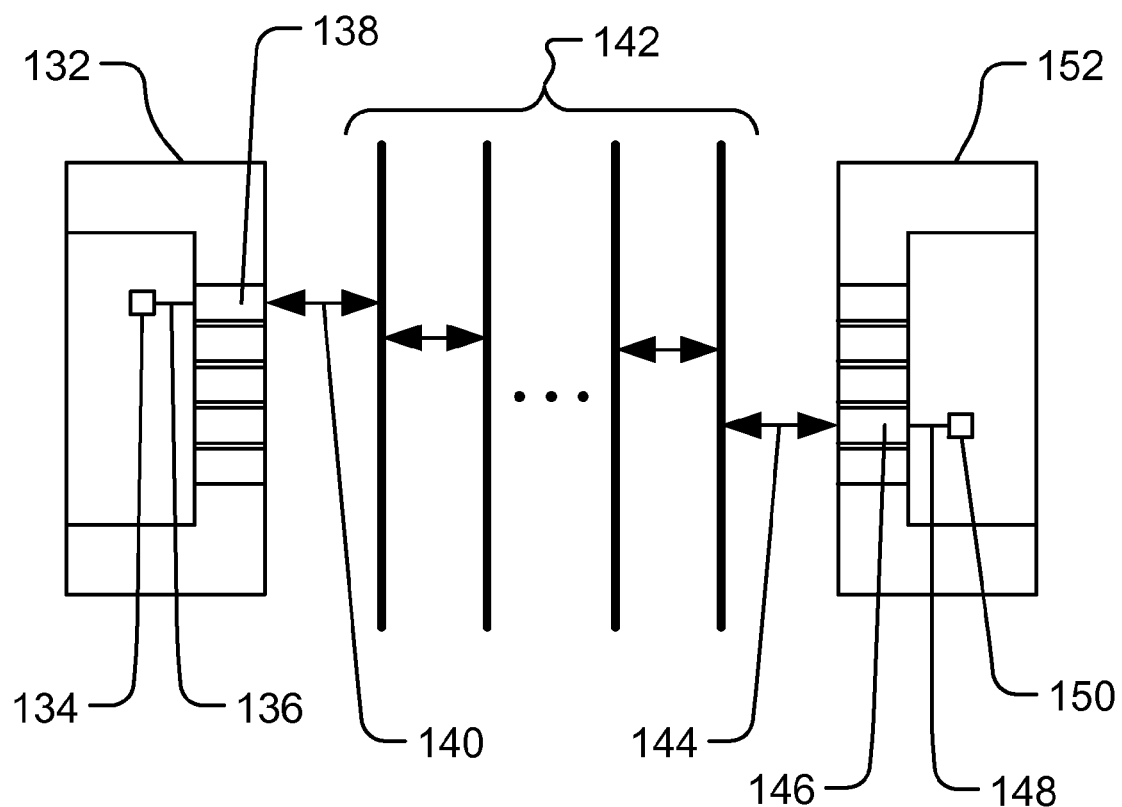
FIG. 1(d) depicts interconnection of logic elements between two (e.g., ASIC) devices through I/O rings, PCB layers and package substrate, as in prior art.

FIG. 1(d) illustrates the interconnect approach between two integrated circuits (such as ASICs) through packaging, as used in prior art. For example, the electrical path is shown from a logic block (134) on the first ASIC (132) to a logic block (150) on the second ASIC (152), through the first chip's metallization layers (136) to the I/O ring (138) of the first ASIC, to the packaging of the first ASIC (140), through the hierarchy of package substrates and the printed circuit board (PCB) connectors (142), through the packaging of the second ASIC (144), to the I/O ring (146) of the second ASIC and the second chip's metallization layers (148). One consequence of such approach in prior art is that the electrical connections between logic blocks or components from such dice (e.g., 132, 152) are limited by the die bumps (and PBC connectors); and therefore, in complex structures, these connections tend to be at the higher component/module levels, instead of transistor/gate levels.

Figure 2:
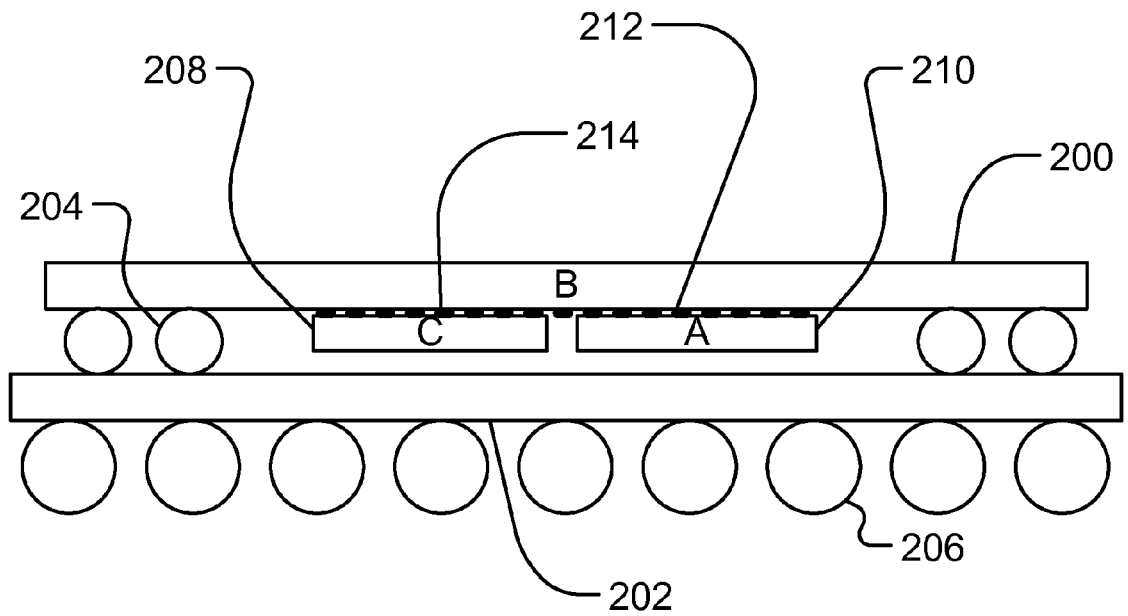
FIG. 2 depicts electrically connecting one or more IC devices to a core die substrate using MPIF with core die substrate connected to a package substrate using bumps, in an embodiment of this invention.

The bumps in prior art (e.g., 104 between 100 and 102) are typically formed by solder ball attachment, wire-bond cuts, conventional sputter/print solder paste, or electroless plating techniques. In an embodiment of this invention, instead of using bumps for electrical connections between two ICs, a fabric of parallel interconnects is used to connect the ICs through a flip-chip configuration. As illustrated in FIG. 2, dice A (210) and C (212) are flipped on die B (200) (using a flip-chip technology) and they are electrically connected to die B through a massively parallel interconnect fabric (MPIF) (212, 214). A large number of connections within the fabric provide the capability to connect the ICs (e.g., IC A and die B) at the transistor/gate level, allowing for a higher integration level permitted by die bumps. For example, in one embodiment, the number of connections in the fabric is in range ten thousand to millions. MPIF provides for a high density of connections which is not currently achievable by bumping or wire-bonding. In an embodiment of this invention, MPIF is used to achieve high density of connections at concentrated/small area(s) on the dies connected via a flip-chip technology.

In an embodiment, illustrated in FIG. 2, die B substrate (200) is placed on the package substrate (202) via bumps (204), and the external electrical connection to the package is provided via the package balls (206).

In an embodiment, e.g., as illustrated in FIG. 2, die B substrate (200) comprises core modules, e.g., logic blocks as in FGPA. The customization of these logic blocks, i.e., configuring interconnects to allow the blocks to be wired together, is achieved through the context die (e.g., 210, 208) via MPIF (e.g., 212, 214). This 3D stacking along with the separation of the logic blocks from the programming/context allows the increase in the density of the logic gates/blocks on the core die substrate (200) by having the programming interconnects allocated to the context die(s)/IC(s) (e.g., 210, 214). Having the customization/context provided by the context die allows the core die substrate to be configurable for multiple applications.

Figure 3:
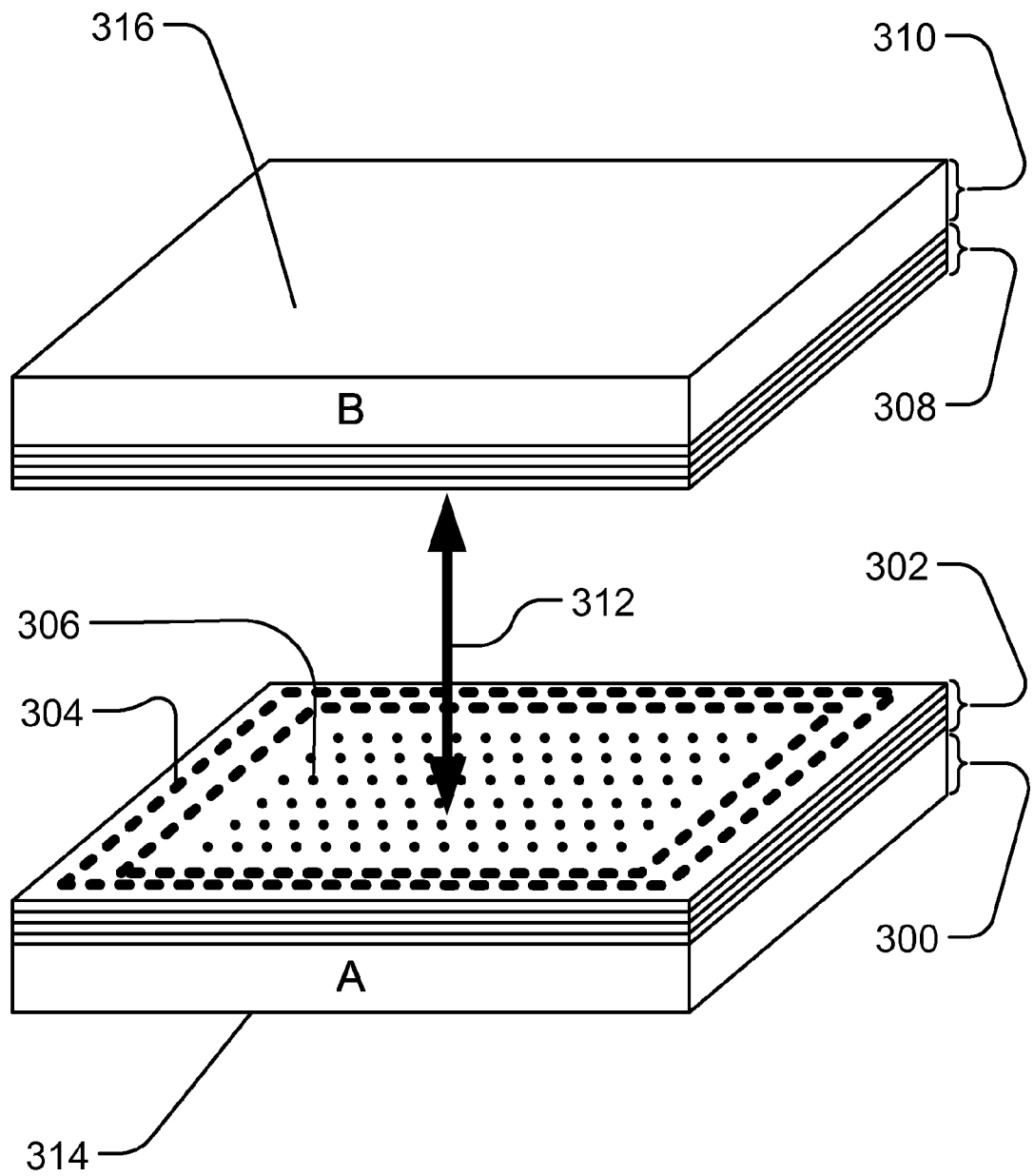
FIG. 3 depicts die to die connection through MPIF, in an embodiment of this invention.

FIG. 3 illustrates a die/die connection (312) through MPIF (306), in an embodiment of this invention. In this example, dice A (314) and B (316) each comprises base layer(s) (300, 310) and metallization/conducting layer(s) (302, 308), respectively. In one embodiment, the dice have standard I/O (304), e.g., at their periphery, which are electrically connected together, as the interconnects are in MPIF. The metallization/conducting layers (e.g., 302 or 308) which are separated by dielectric layers are patterned to route the electrical signals/power across the die. Multiple layers are used to let the designers route electrical signals cross over each other. The conducting layers are also electrically connected, e.g., through vias.

Figure 4:
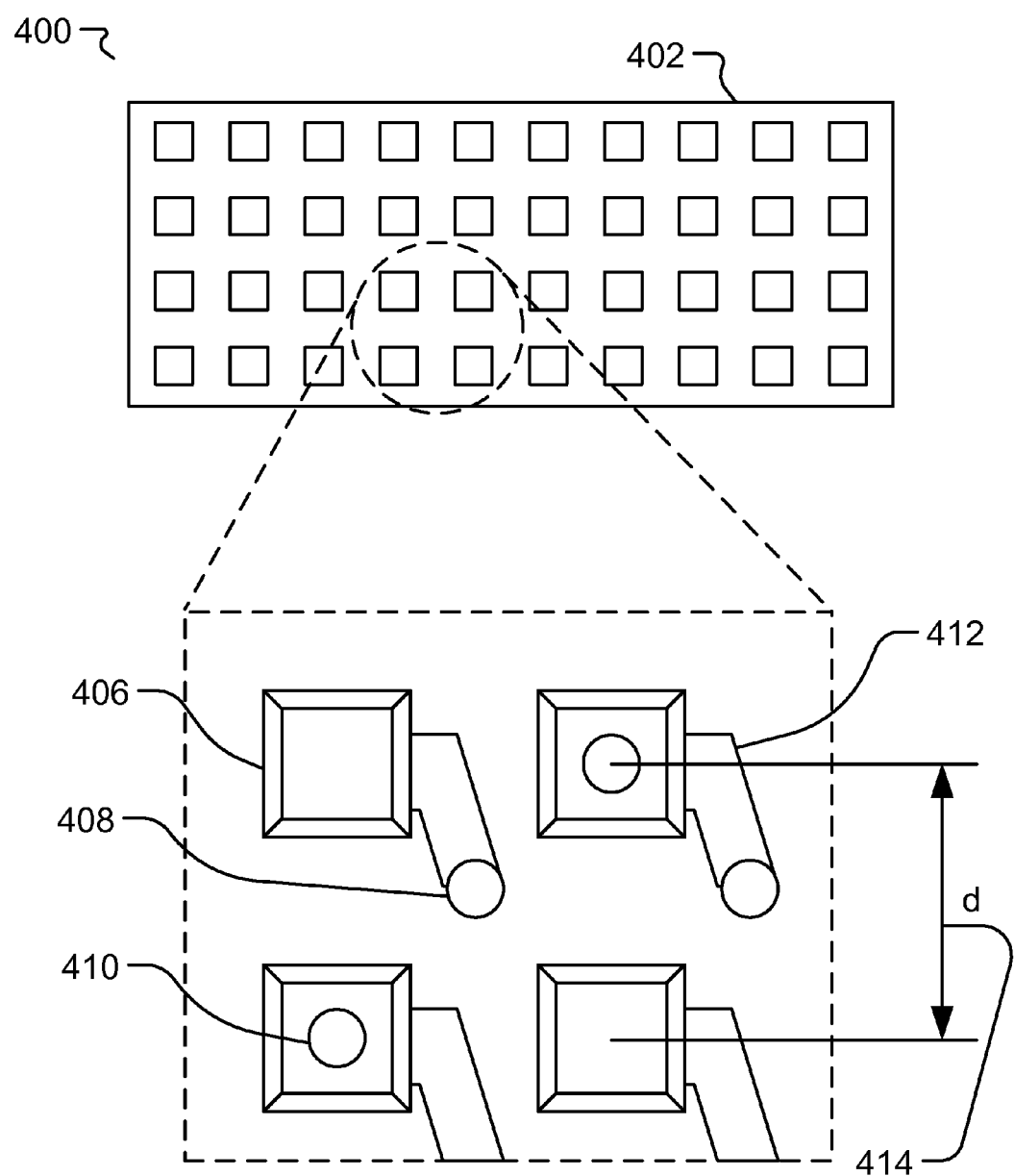
FIG. 4 depicts MPIF vias used in die to die connection in an embodiment of this invention.

In one embodiment, as illustrated in FIG. 4, the MPIF (400) on a die (402) is formed by a series of die-die MPIF pads (406). The MPIF vias (e.g., 408 and 410) provide the electrical connection between the pads and the transistors/gates on the die. In one embodiment, the inter-pad spacing in MPIF is typically about 10-50 µm. In one embodiment, the pads are regularly spaced in both horizontal and vertical direction, e.g., having a fixed distance d (414). In another embodiment, the pads are distributed in non-uniformly. In one embodiment, MPIF on a die supports millions of pads per $cm^2$, for die-die connection. The Re-Distribution Layer (RDL) (412) provides the electrical connectivity between the pads and the lower metallization layers, while reducing the interdependency between the package and die integration.

Figure 5:
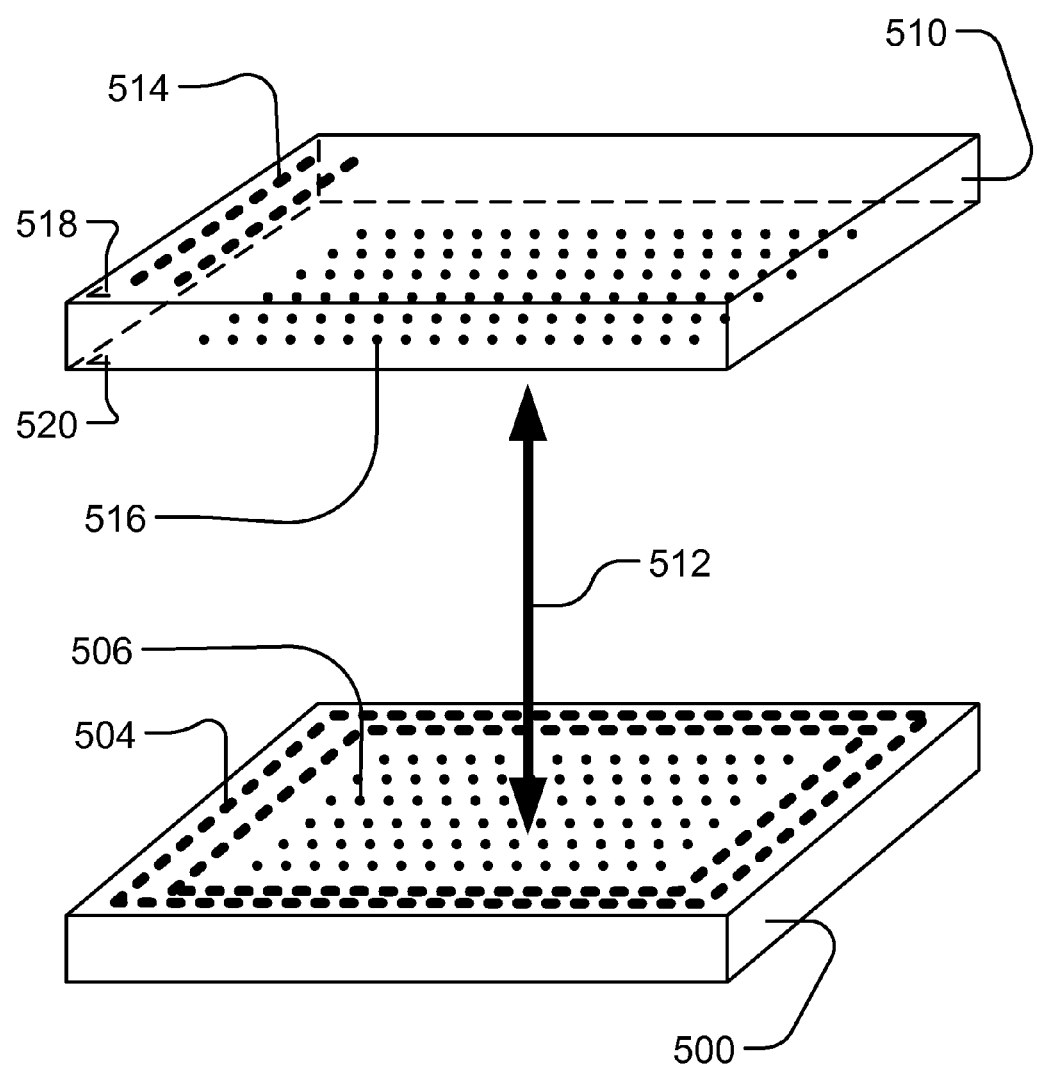
FIG. 5 depicts MPIF contact patterns on both dice in an embodiment of this invention.

In an embodiment of invention, as illustrated in FIG. 5, a programmable platform die (500), e.g., an ASIC, is electronically connected (512) to a programming/context die (510) through MPIF by flipping the context die (510) on its surface (520) containing the MPIF pad patterns (516) to the MPIF patterns (506) on the programmable die (500). In one embodiment, the context die (510) includes a programming interface (514). In one embodiment, the programming interface is located on the opposite surface (518) from the flipped surface (520) of the context die (510), so that after MPIF connection between the dice, the context die is programmed through the programming interface (514). In one embodiment, the context die includes programmable switches that electrically connect the MPIF (516) pads on the context die (510), causing electrical connection between the gates/transistors, e.g., in logic blocks, on the programmable die (500) having associated MPIF (506) pads. In one embodiment, the programmable die (500) includes a platform fabric I/O (504). In one embodiment, the platform fabric I/O provides I/O for specific purpose function, e.g., Serializer/Deserializer (SerDes) functional blocks used to convert data between serial data and parallel interfaces in each direction in high speed communications. In one embodiment, the platform fabric I/O provides input/output for generic purpose. In one embodiment, the customization/programming is provided in a system configuration output file which is implemented in the context die (510) through the programming interface (514).

Figure 6:
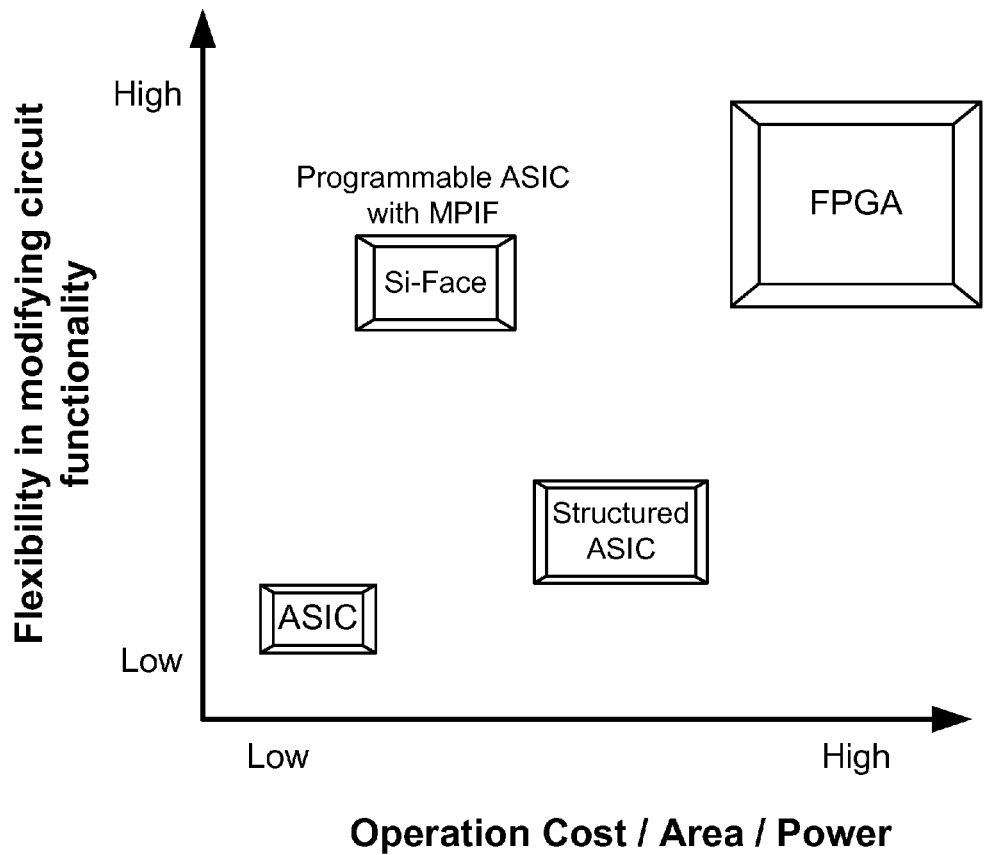
FIG. 6 qualitatively illustrates the flexibility in modifying circuit functionality and cost/area/power in an embodiment of this invention (labeled as Si-Face) and ASIC, Structured ASIC, and FPGA technologies.

FIG. 6 qualitatively illustrates the flexibility in changing circuit functionality (e.g., by programming) versus operation cost/area/power consumption for SoC solution space including ASIC, Structured ASIC, FPGA, and an embodiment of this invention, labeled Si-Face (e.g., with a context programming die stack on a core programmable die through flip-chip and electrically connected via MPIF). Note that this operation cost does not include the Non Recurring Engineering (NRE) costs. Traditional ASIC has the lowest cost/area/power consumption, but it offers the least flexibility in modifications to the circuit functionality. For example, the changes in the circuit often results in redoing the mask set and time consuming re-qualification of the design. Structured ASIC provides more such flexibility than traditional ASIC, by letting the last metallization layers (with vias) to be customized (i.e., hard-programmed) on a core of the logic blocks/modules. The changes to the design is reflected in the changes to those metallization layers and not necessarily all the mask set. As the result the size of the die is increased to allow for this flexibility. FPGA provides even more flexibility than Structured ASIC by letting the programming be performed at the field without using irreversible processing steps by the manufacturer. This represents no or little upfront NRE. Because of programmable switches in FPGA, the area requirement and the power consumption is the highest, while FPGA performance is typically inferior. In contrast, due to the 3D core stacking of an embodiment of this invention, the area requirement (e.g., for interconnects) for the programmable ASIC is reduced, while the flexibility in circuit programming is provided on the context die connected to the programmable ASIC through MPIF. For example, this allows the reconfigurability iterations to be performed on context die without affecting the core programmable die.

Figure 7A:
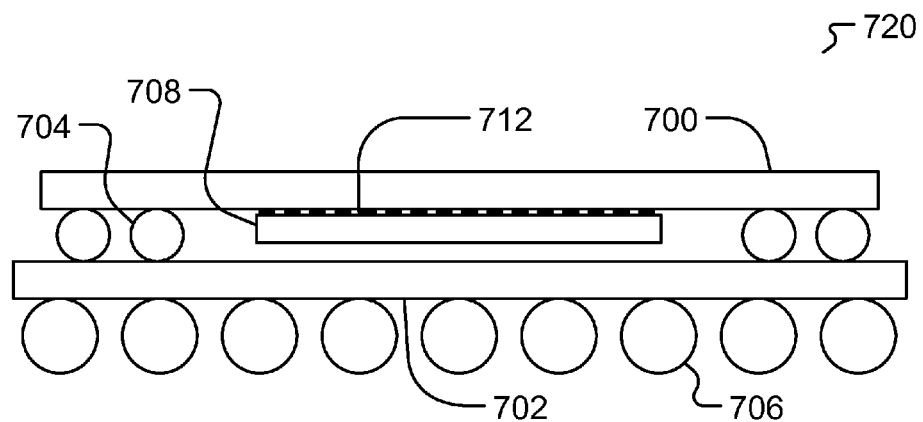
FIG. 7(a) illustrates the preproduction/prototyping of context/programming a core IC using a context IC through MPIF in an embodiment.
Figure 7B:
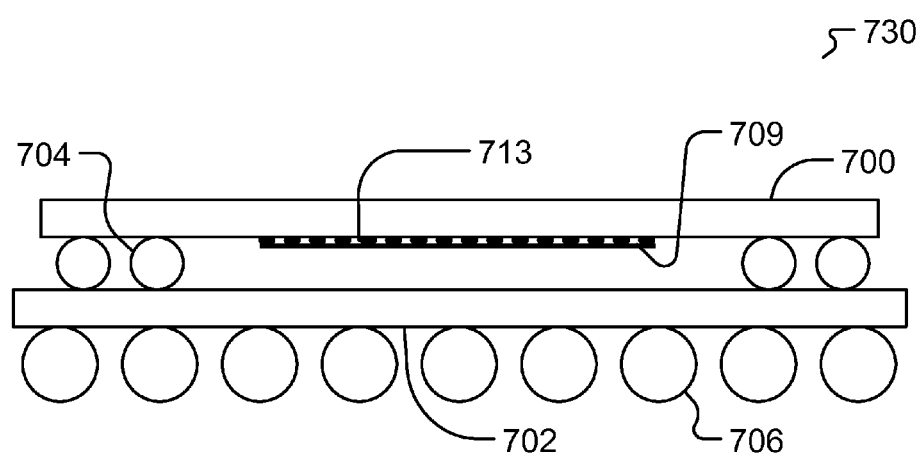
FIG. 7(b) illustrates the programming of a production version by fusing conducting (e.g., metal pads on the core IC in an embodiment.

Even though the NRE cost of FPGA approach is low compared to ASIC, there is still a significant conversion time and re-qualification involved to move the design from FPGA to ASIC, in order to reduce the operational cost and power consumption and/or increase the performance. Such a conversion may involve creating a logical configuration of the system from the already qualified FPGA and physically re-implementing it in an ASIC. Another approach may replace the FPGA programmable switches with permanent ones (e.g., by fusing) without drastic change in the form factor; however, this approach would not result in a saving in area or a significant enhancement in performance. In contrast, in an embodiment of this invention, as illustrated in FIG. 7(a), the preproduction or prototyping is done by using a context die (708) flipped and electrically connected to a core programmable die (700) through MPIF (712). In one embodiment, the pre-production (720) testing is performed by flipping the core die substrate (700) on a package substrate (702) after bumping (704) the core die substrate (700). In one embodiment, the programming of the circuit is done through the package balls (706), package substrate (702), die bumps (704), a set of circuits and/or interconnects on the core die substrate (700) (e.g., dedicated for passing/processing the programming signals to the context die (708) though MPIF (712)). In such configuration, the base platform of the core programmable die (700) retains an ASIC like density of gates/transistors given that the switches for interconnects are pushed to the context die (708) and the many interconnects/high density interconnects in the MPIF (712) provide the flexibility to customize the circuit at the gate/transistor level on the core IC (700). In one embodiment, the testing and debugging iterations are performed by reprogramming the context die (708). In one embodiment, the context die connected through MPIF with the core die substrate is used in production. In another embodiment, as illustrated in FIG. 7(b), the conversion to cost-reduction or production version (730) includes creating a set of metallization mask from the qualified and tested configuration used in context die (708), using the metallization masks to permanently fuse (709) the MPIF pads (713) of the core die substrate (700) before bumping the core die substrate and placing it in the package. In this approach, the re-qualification of the production version (730) is minimized as the core die substrate and the package substrate remain the same. The operation cost is reduced as the few metallization steps much less impact the cost per die. In one embodiment, the yield increases as the metallization steps replace the connections via a flip-chip technology. In one embodiment, the performance increases as the permanent connections on the MPIF pads (instead of programmable switches) require less power, and present less delay. In addition, the time required to get to production is significantly reduced, because the development/prototyping cycle is relatively short due to in field programmability through MPIF and the context die, and the conversion cycle is short given that the form factors (die and package) and configurations are essentially unchanged.

Figure 8:
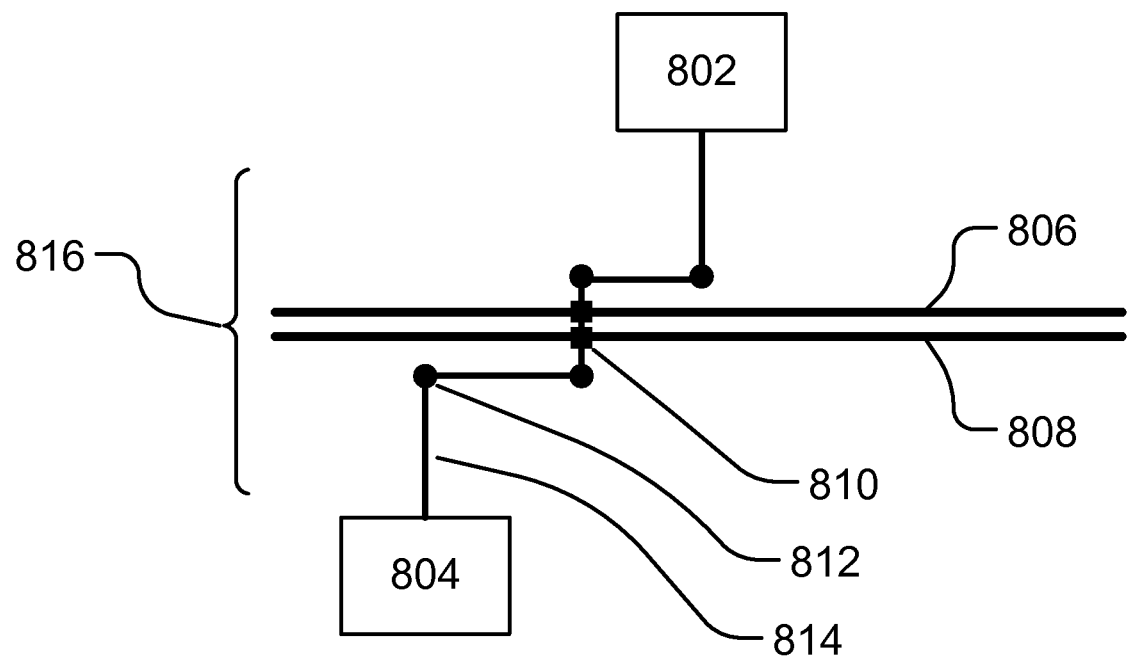
FIG. 8 depicts the construction of MPIF in an embodiment of this invention.

FIG. 8 schematically illustrates the electrical connection, in one embodiment, between circuits (802 and 804) (e.g., transistor/gates/flip-flops/switches) on the dice connected through an MPIF (816) construction. The connection from the circuits (e.g., 804) is through the metallization/conducting layers (e.g., copper trace) (814), via (812), RDL (808) for the bottom die, and the MPIF die-die pads (810), and RDL (806) and via and metallization layers of the top die. In one embodiment, protection circuits are also provided (not shown) on one or both dies within the circuits (e.g., 802 or 804) or in parallel to the circuits to protect MPIF pads against electrostatic discharge (ESD). For example, such protection circuits include shut diodes to substrate.

Figure 9A:
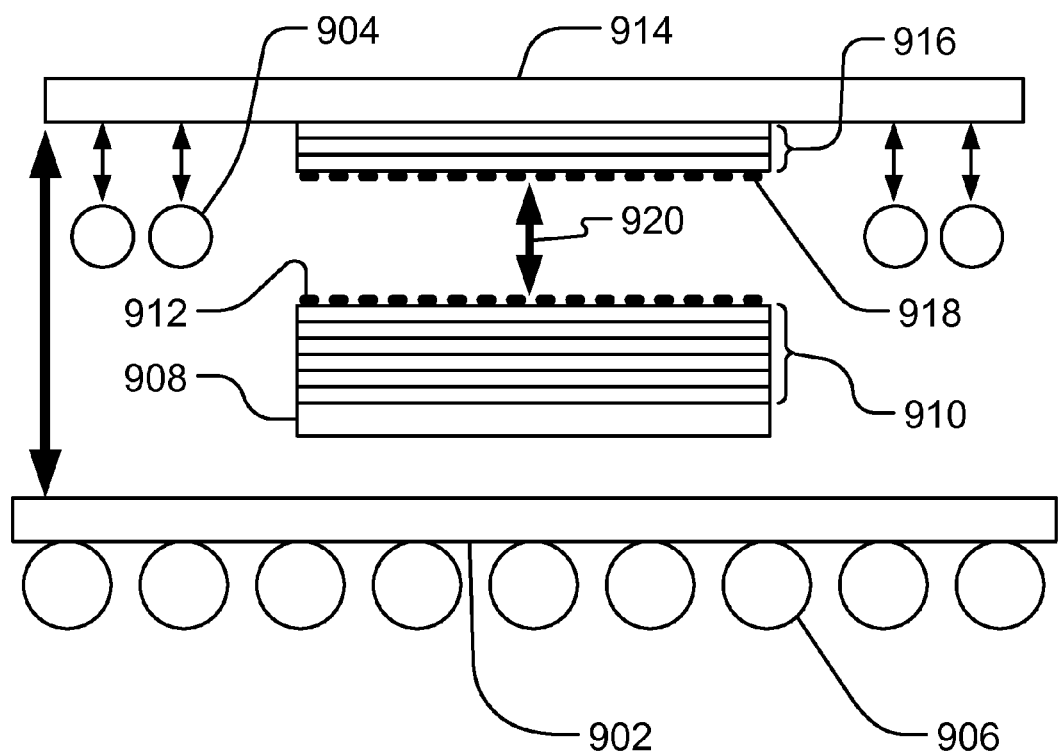
FIG. 9(a)-(c) depict cross sections of a programming IC connecting through MPIF to a core IC die which is connecting to a package substrate through bumps, in an embodiment of this invention.

FIG. 9(a) illustrates (900) an embodiment of this invention (not to scale) including a core die substrate (914) (e.g., a silicon substrate with structured gates, memory, and I/O), with core metallization/conducting layers (916) (e.g., comprising of three metallization layers: metal 1 and 2 used for basic gate construction on the core die substrate (914), and metal 3 used for fabric interconnect) and MPIF (918) pads. In an embodiment, the programming device/die (908) (e.g., a silicon substrate) includes interconnect routing fabric (910) (e.g., with 6-9 layers of metallization/conducting layers), and MPIF (912) pads. In an embodiment, the programming device (908) is flipped (920) on the core IC/die substrate (914). In one embodiment, the core die substrate is bumped (904) and placed in a package substrate (902) having package balls (906) for external connection. In one embodiment, the bumping of the core die substrate is done prior to flipping the programming device (908) on to the core die substrate (914), while in another embodiment, the bumping occurs afterwards.

Figure 9B:
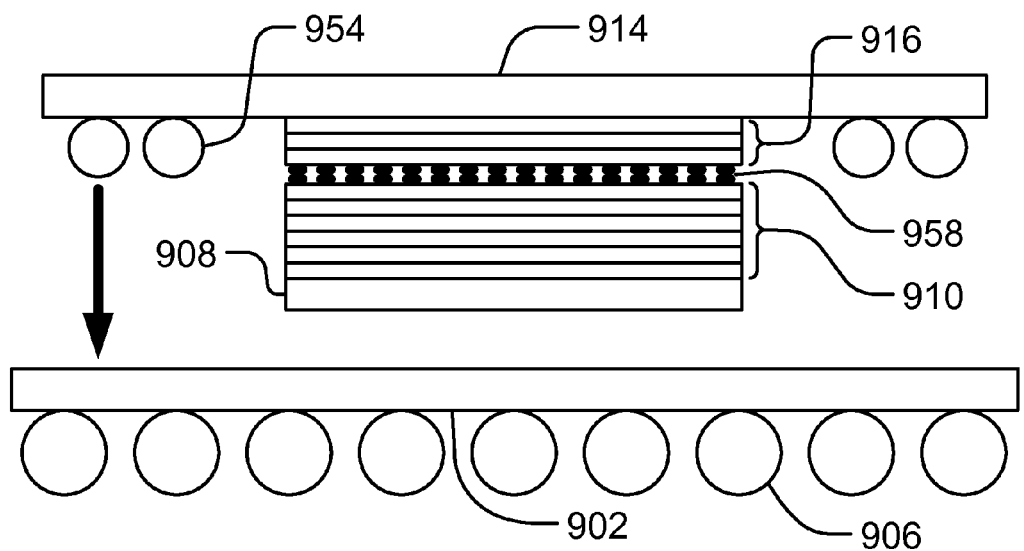
Figure 9C:
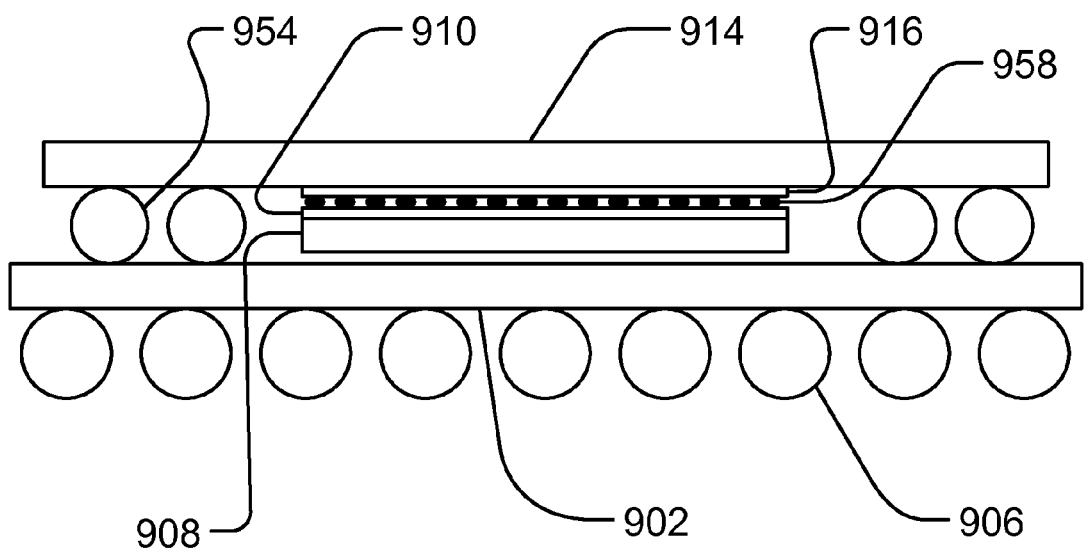

FIG. 9(b) illustrates (950) an embodiment of this invention (not to scale) having the programming device (908) flipped-on the core die substrate (914), and the MPIF (958) formed by the connection of the MPIF pads from the core die substrate (914) and the programming device (908). After flipping the programming device and bumping the core die substrate (954), the core die substrate is placed in the package substrate (902). FIG. 9(c) illustrates (980) an embodiment of this invention with the core die substrate placed in the package substrate in flip-chip configuration using the die bumps (954) for electrical connection.

Figure 10:
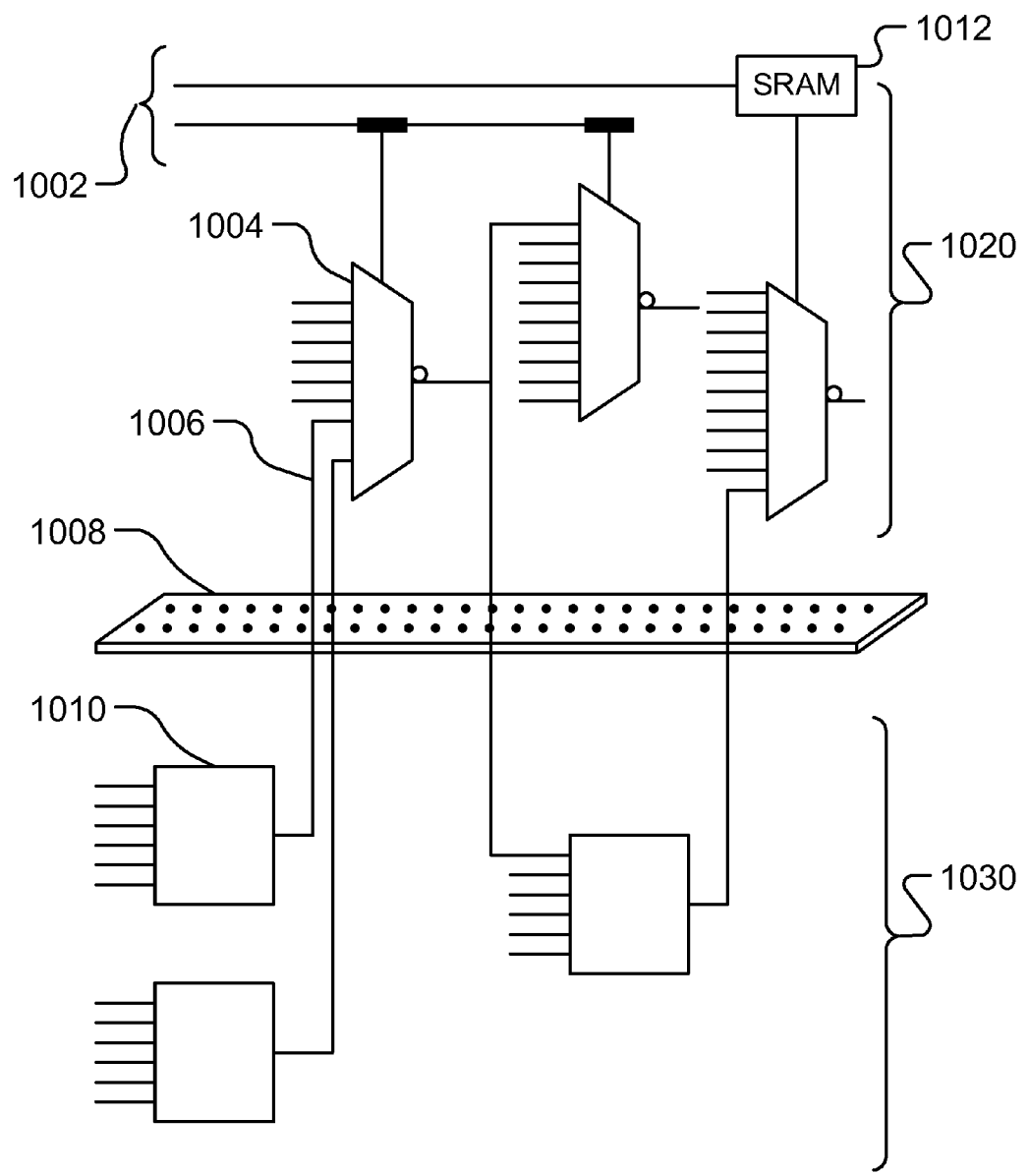
FIG. 10 illustrates an example of using MPIF for connecting the logic blocks and programming elements residing on two dice, in an embodiment of this invention.

FIG. 10 is a schematic of an embodiment of this invention, where the logic blocks/elements (1010) in the core die substrate (represented by 1030) are connected through MPIF (represented by 1008) to a programming die (represented by 1020) which provides the electrical connectivity between the ports/gates of the logic elements (1010) using metallization/conducting layers and vias (represented by 1006) and controlled switches/selectors (1004) (e.g., MUX) driven by the programming devices' (1020) programming interface (1002) as well as the logic blocks/gates from the core die substrate and the programming device. In one embodiment, transistor switches (not shown) are used as controlled switches. In one embodiment, the programming interface feeds into a memory, e.g., SRAM (1012), which drives the controlled switches/selectors (e.g., MUX and transistors).

In one embodiment, a "hard" programming is done in the context die by making permanent electrical connection between MPIF pads on the context die, e.g., by explicit routing mask set using the metallization/conducting layers and vias, or using fuse or antifuse technology to implement the configuration file. In this approach, the core die substrate remains the same (i.e., no redesign), but the adjustment/debugging is implemented on the context die without having to repeat all the processing steps of the core die substrate. In this approach the density of gates/transistors is further increased by reducing/eliminating circuit elements needed for reprogramming the context die.

Figure 11:
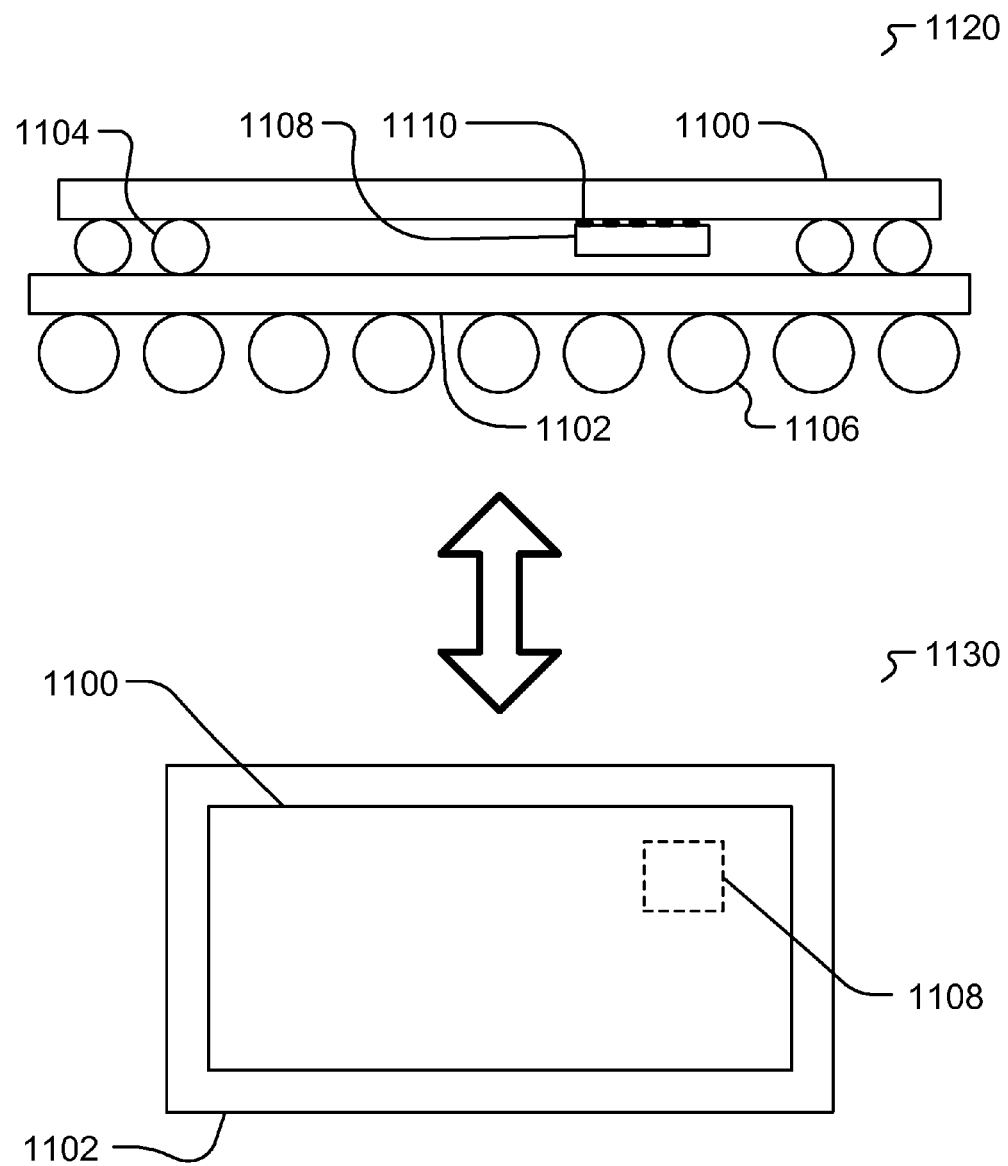
FIG. 11 depicts connecting an FPGA to a core die substrate through MPIF.

FIG. 11 illustrates an embodiment of this invention (1120), where an FPGA core (1108) provides its functionality to the main device IC/die (1100) through the MPIF (1110). Such embodiment provides a platform for emerging applications requiring partial programmability. In an embodiment, the FPGA core die (1108) is flipped on the main device die (1100) with MPIF providing the signal and power to the FPGA core. In one embodiment, the main device die substrate (1100) is bumped (1104) and flipped on a package substrate (1120) having package balls (1106) for external connectivity. FIG. 11 also depicts the top view (1130) of such an embodiment. The examples of FPGA core functionality include custom applications such as signal processing, hardware implementation of Java Virtual machine (JVM), and graphics.

Figure 12:
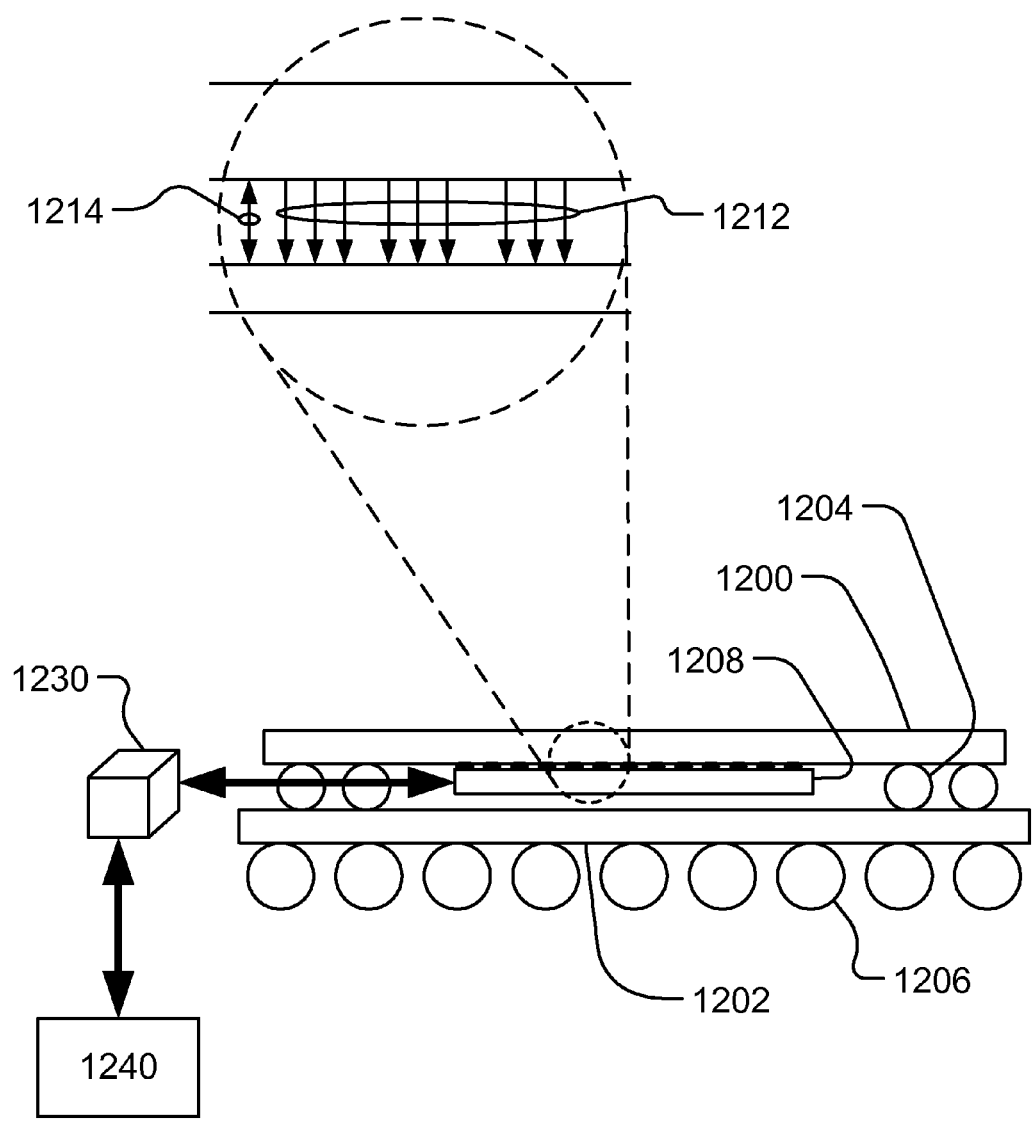
FIG. 12 illustrates Lab-On-Chip using MPIF.

In an embodiment of this invention, e.g., as depicted in FIG. 12, MPIF is placed strategically a die substrate (1208) (here referred to as on Lab-on-Chip (LoC)) to provide datapath/signal-path connectivity/probing (1212) to the prototyping or the production device (1200). In one embodiment, these connections are configured to be triggered on series of events and the data-path to be captured, e.g., into large memory buffers, e.g., available on the LOC substrate (1208). In an embodiment, the data in the LOC memory is examined by a logic analyzer or a computing device (1240) via a probe card (1230). For example, the probe card reads the memory content through LOC substrate (1208), MPIF (1214), the production substrate RDL, the bumps (1204) placed on the production device (1200), the package substrate (1202), and the package balls (1206). In one embodiment, the large number of pads on MPIF allows sampling many ports on logic blocks, gates, or transistors on the production device, which would otherwise be inaccessible or only indirectly accessible. In one embodiment, the circuitry on the LOC substrate selects a set of MPIF pads to sample, and programmatically switches the signal from those MPIF pads to the LOC's memory. In one embodiment, the selection of the MPIF pads (to sample) is driven by the programming signal from the logic analyzer/computing device (1240). In one embodiment, the selection is driven by the signal from the production substrate and/or the logic blocks on LOC substrate.

In one embodiment, LoC is used for debugging a complex IC or SoC, which for example do not have effective means of debugging on-chip circuitry. In such an embodiment, LOC allows seamless interface to on-chip signals and buses to trap and capture events for real-time debugging. In one embodiment, using a simple low cost RDL after debugging the SOC or IC, removes the debugging feature for production runs. Using MPIF to capture the signals from the chip under test significantly increases the capture rate as well as the number of signals captured compared to other approaches. For example, in one embodiment, the capture rate on the LoC is in order of (but not limited to) 500 MHz. Other capture rates are also part of the scope of this invention.

Figure 13:
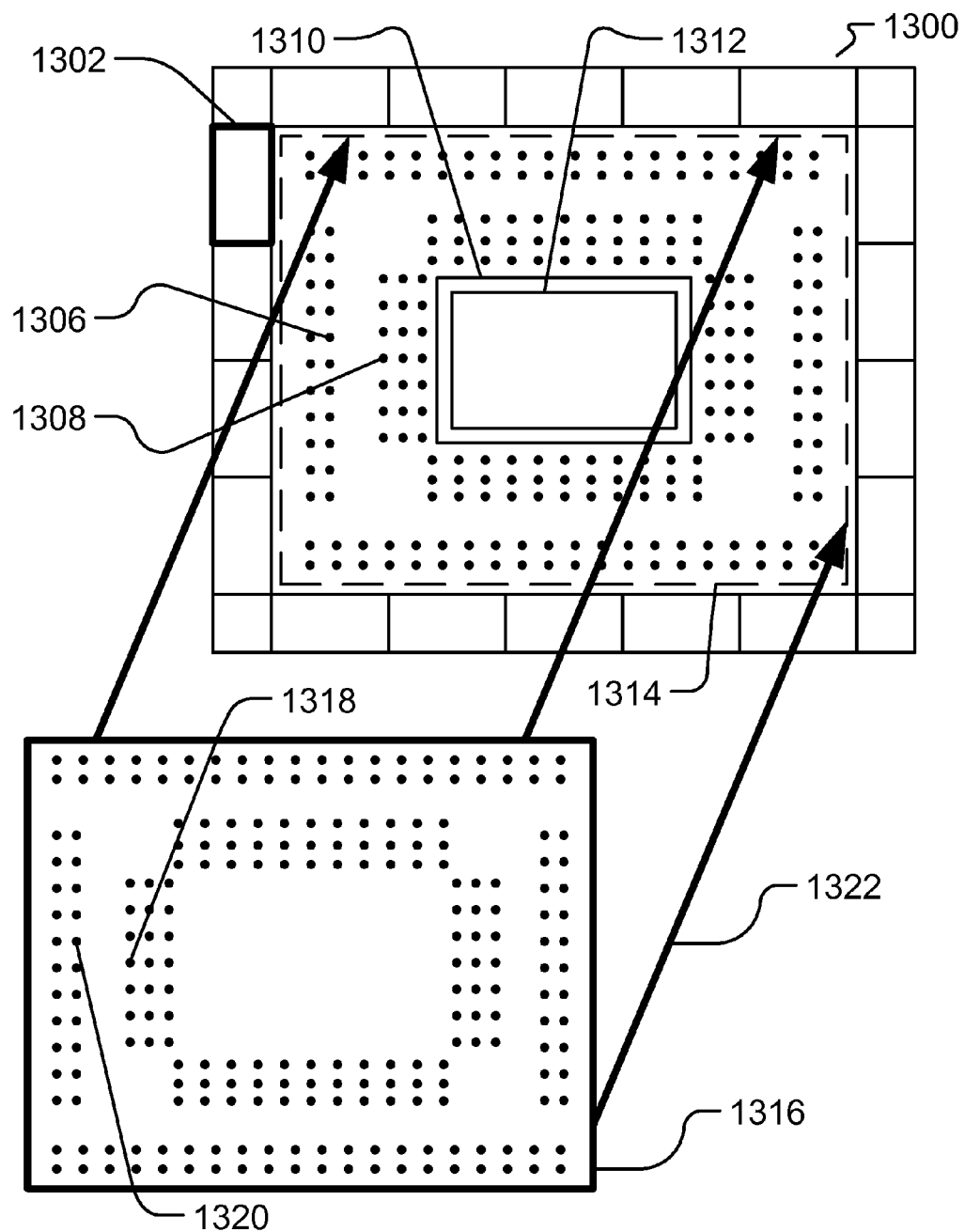
FIG. 13 illustrates programming a base platform (e.g., multi-function SerDes platform) substrate using an overlaying die through MPIF.

In an embodiment of this invention, as illustrated in FIG. 13, the core die substrate (1300) provides a multi-function platform, e.g., multi-function SerDes platform (MFSP) and/or other MXS macro blocks such as USB, ADC, and DAC. As an example, the SerDes platform provides functionality for XAUI, PCIe Gen 1 and 2, SATA 1 and 2, and Interlaken, having one or more SerDes blocks (e.g., 1302) located at the periphery of the core die substrate (1300) and a memory management circuit (1310) and a memory module (1312) placed in the middle of the substrate. In one embodiment, the MPIF is placed on the core die substrate with a set of MPIF pads (e.g., 1308) electrically connected to, for example, the memory management/module and a set of MPIF pads (e.g., 1306) electrically connected to, for example, a SerDes block. In one embodiment, the custom design includes custom logic (1316) that is attached (1322) to the MFSP platform allowing different applications via MPIF to benefit from the same set of base functionality. This would allow reduction in resources and time associated with the development of the final product. In one embodiment, the custom design die/chip (1316) having the MPIF pads (e.g., 1318 and 1320) is flipped (1322) on the core die substrate (1300), and through MPIF, the custom design chip provides the custom application functionality by, for example, enabling electrical connectivity between an element in a SerDes block and the memory management/module through MPIF (e.g., through MPIF pads from 1306, 1320, 1318, to 1308). In one embodiment, the MFSP has a Quad SerDes block (1302).

Figure 14:
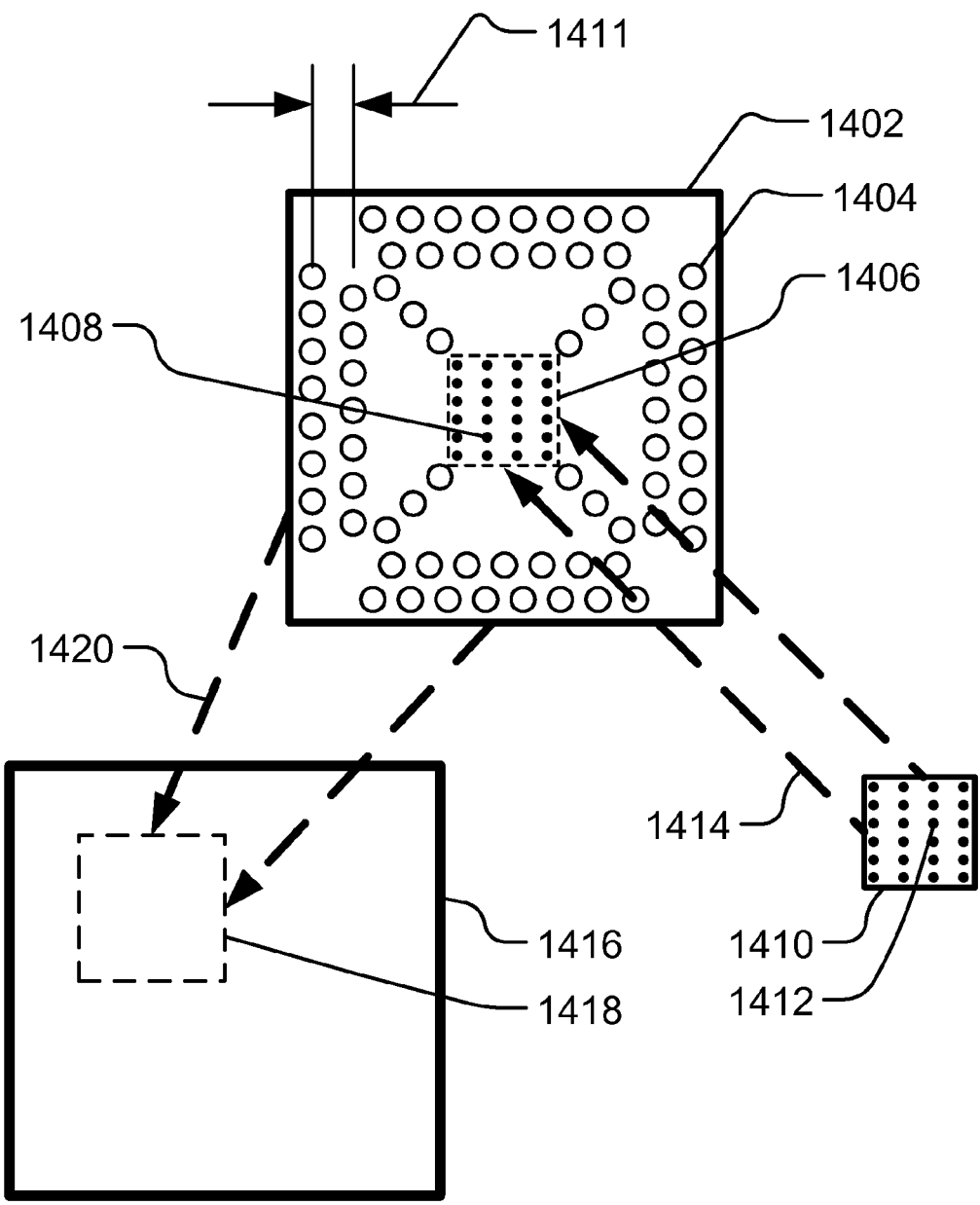
FIG. 14 illustrates an example of MPIF foot print (keep-out area) on a main die substrate for an embodiment of this invention.
Figure 15:
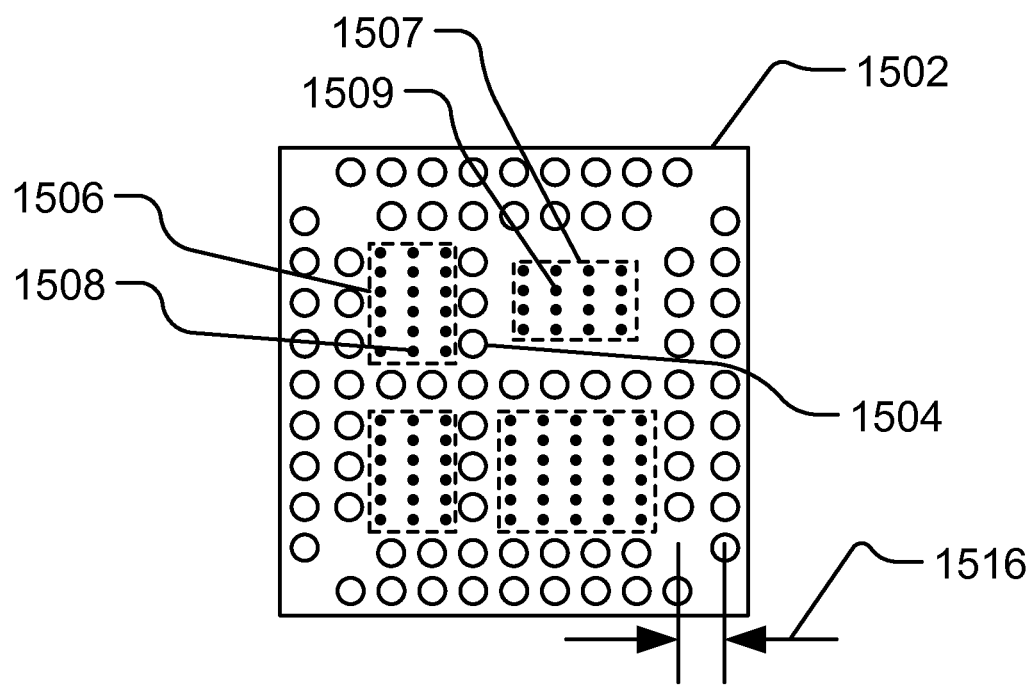
FIG. 15 illustrates an inner bump pattern for additional standard connectivity, in an embodiment of this invention.

In an embodiment of this invention, as illustrated in FIG. 14, an MPIF footprint (1406) is used as keep-out-area for I/O ring placement on a core die substrate (1402). In an embodiment, the MPIF footprint is used to flip-chip (1414) a context die (1410) with MPIF (1412) pads on to the core die substrate (1402), to provide the electrical connectivity between the context die and the core die substrate through MPIF (e.g., 1408 and 1412) pads. In an embodiment, the core die substrate is bumped (1404) and flipped (1420) on to the package substrate (1416) at a predefined location (1418). In one embodiment, a set of bumps (1404) are set in one or more columns (1411), rows, or diagonally. In one embodiment, the bumping occurs prior to flipping the context die; while in another embodiment, the bumping occurs after the flipping the context die. As illustrated in FIG. 15, in one embodiment, the core die substrate (1502) has multiple MPIF footprints (e.g., 1506 and 1507) having a set of MPIF pads (e.g., 1508 and 1509) located in each MPIF footprint. The bumps on the core die substrate are set in various patterns (e.g., one or more rows or columns (1516)). In one embodiment, some inner bumps (e.g., 1504) are placed in areas between the MPIF footprints to provide additional standard connectivity to the package substrate.

Figure 16:
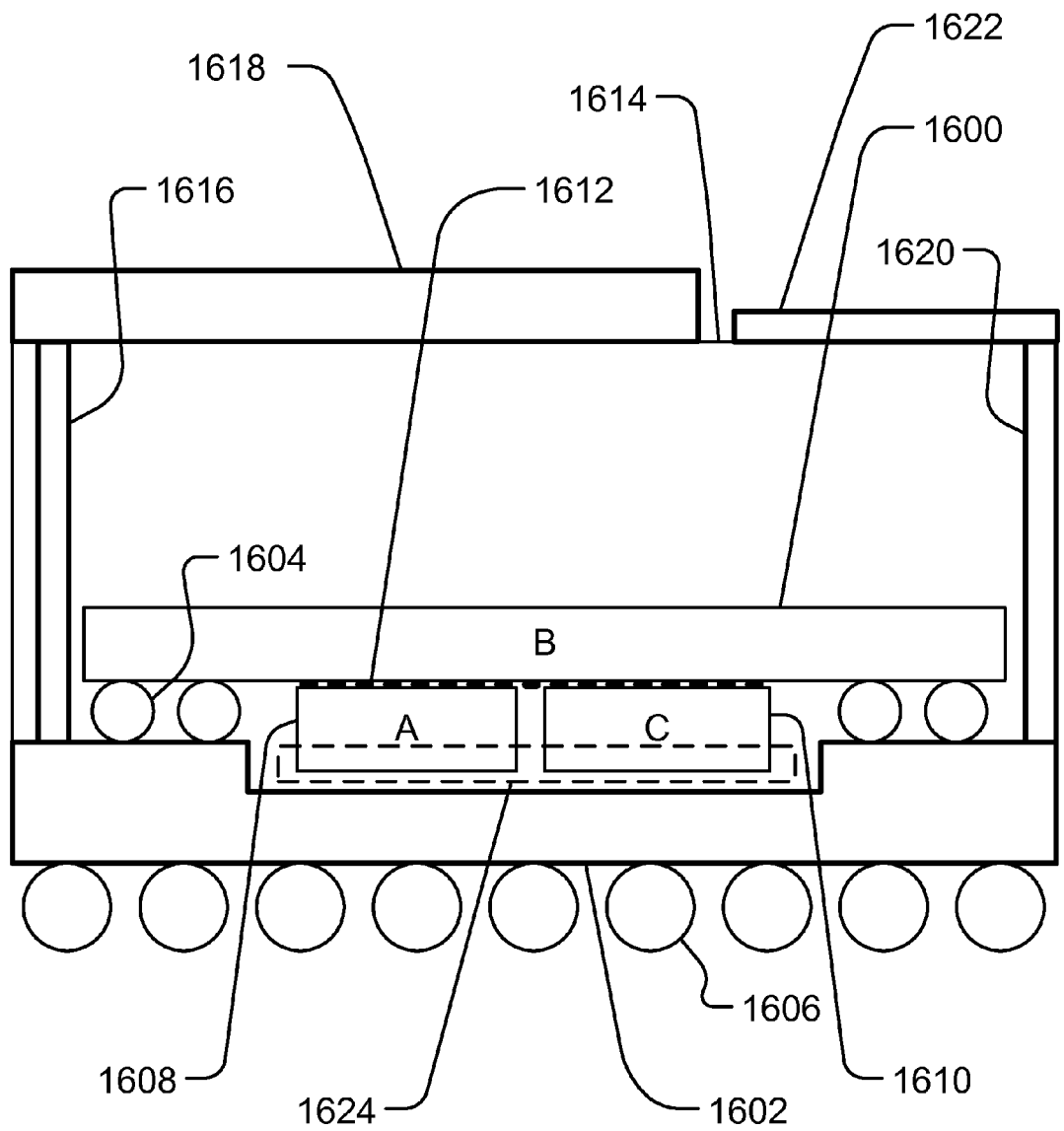
FIG. 16 depicts an example of package substrate with a blind cavity for fitting dice connected through MPIF, in an embodiment of this invention.

As illustrated in FIG. 16, in one embodiment, the package substrate (1602) includes a blind cavity (1624) to fit part of one or more context dice (e.g., IC device A (1608) and IC device C (1610)) that are flipped on a core die substrate (e.g., IC device B (1600)) which is in turn flipped on the package substrate over its bumps (1604). The context dice are electrically connected to the core die substrate through MPIF (1612). In one embodiment, the package includes other features such as heat slug (1618) and/or antenna (1622) that are connected to the package substrate through vias (1616 and 1620, respectively). In one embodiment, the package elements are protected by a molding/protective compound (1614) and the electrical connection to the package is provided through the package balls (1606).

Figure 17:
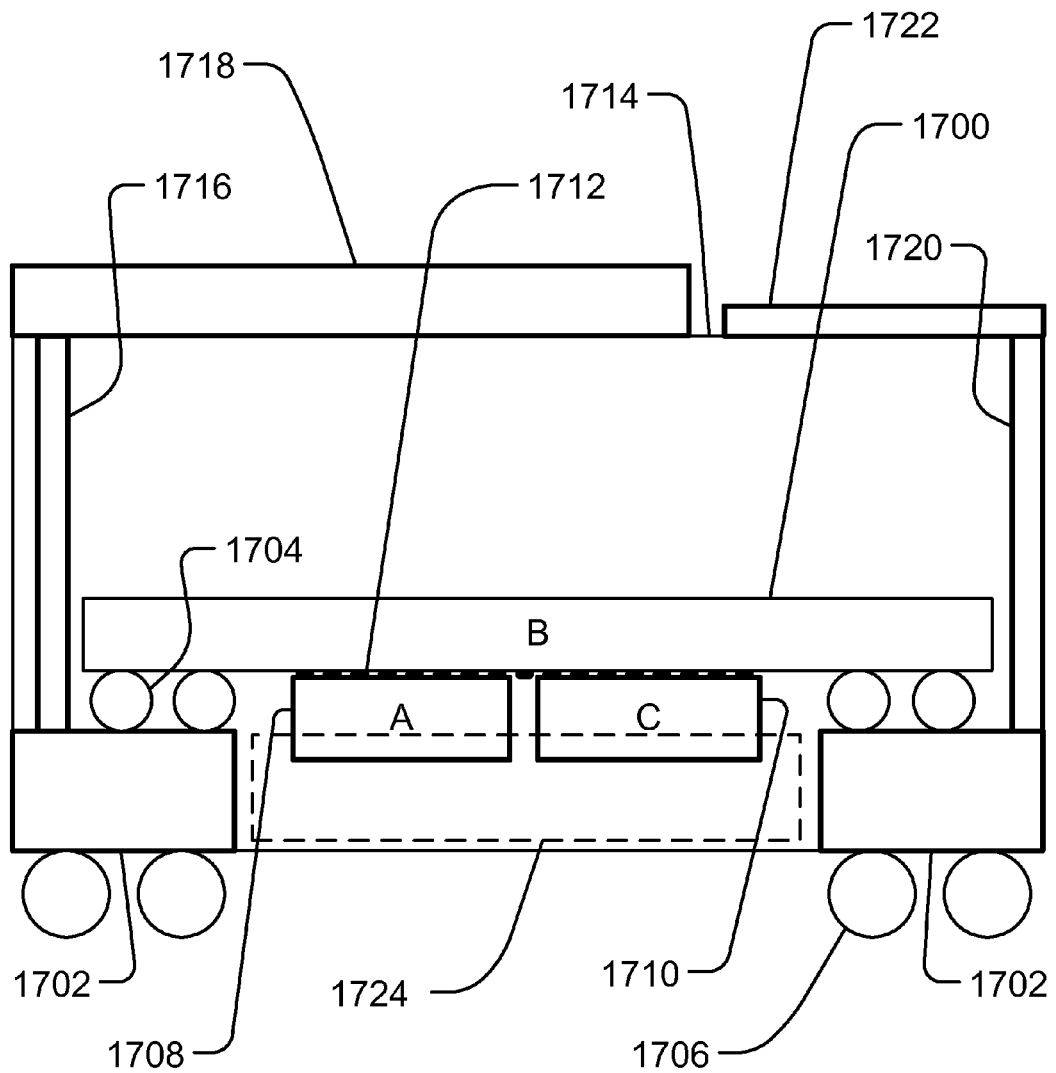
FIG. 17 depicts an example of package substrate with a through cavity for fitting dice connected through MPIF, in an embodiment of this invention.

As illustrated in FIG. 17, the package substrate (1702) includes a through cavity (1724) to fit part of one or more context dice (e.g., IC device A (1708) and IC device C (1710)) that are flipped on a core die substrate (e.g., IC device B (1700)) which is in turn flipped on the package substrate over its bumps (1704). The context dice are electrically connected to the core die substrate through MPIF (1712). In one embodiment, the package includes other features such as heat slug (1718) and/or antenna (1722) that are connected to the package substrate through vias (1716 and 1720, respectively). In one embodiment, the package elements are protected by a molding/protective compound (1714) and the electrical connection to the package is provided through the package balls (1706).

Figure 18:
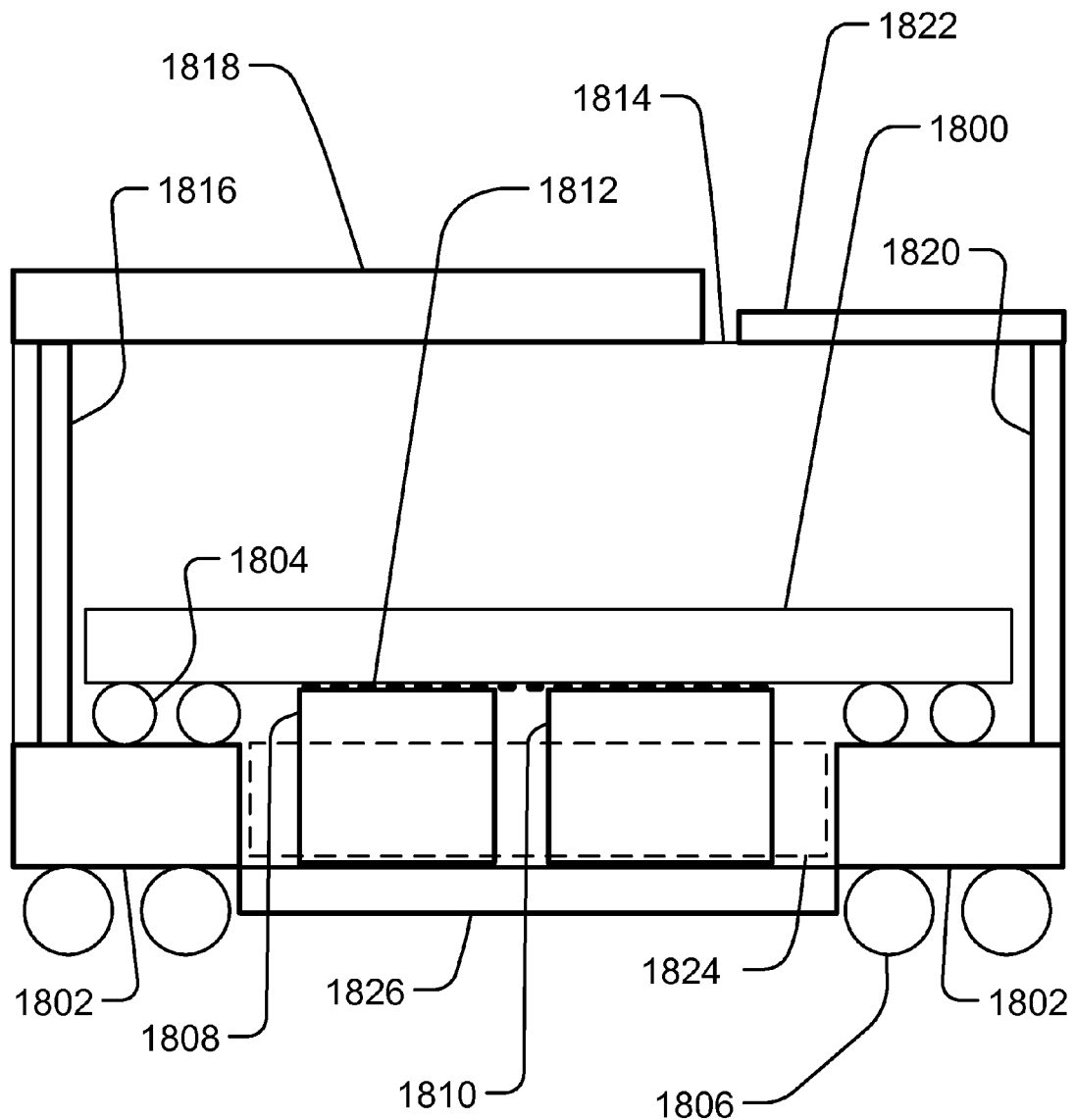
FIG. 18 depicts an example of package substrate with a cavity for fitting dice connected through MPIF while allowing for heat sinking the dice, in an embodiment of this invention.

As illustrated in FIG. 18, the package substrate (1802) includes a through cavity (1824) to fit part of one or more context dice (e.g., IC device A (1808) and IC device C (1810)) that are flipped on a core die substrate (e.g., IC device B (1800)) which is in turn flipped on the package substrate over its bumps (1804). The context dice are electrically connected to the core die substrate through MPIF (1812). In this embodiment, a heat slug (1826) is attached to the context die(s) exposed through the cavity (1824). In one embodiment, the package includes other features such as heat slug (1818)

and/or antenna (1822) that are connected to the package substrate through vias (1816 and 1820, respectively). In one embodiment, the package elements are protected by a molding/protective compound (1814) and the electrical connection to the package is provided through the package balls (1806).

Figure 19:
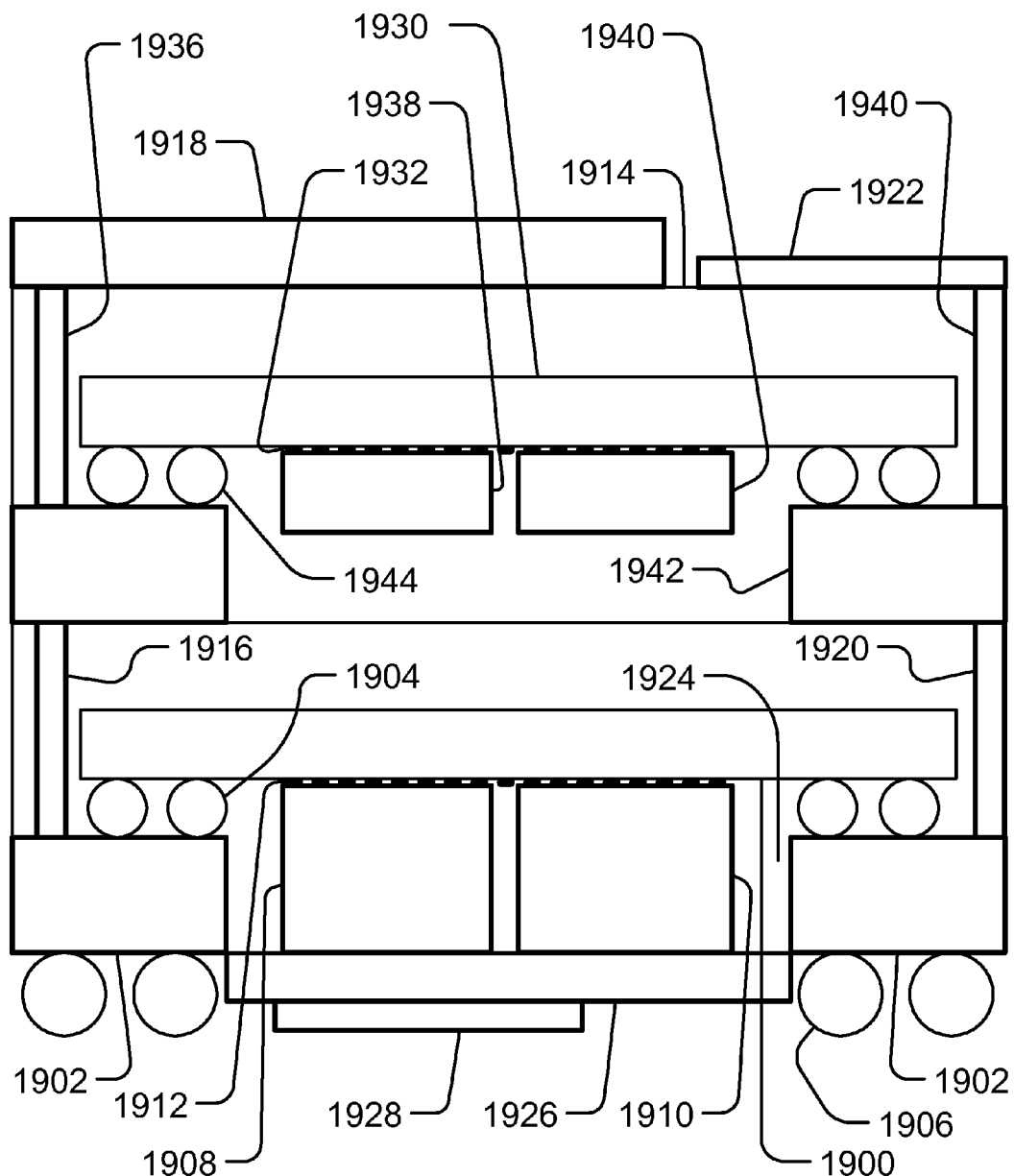
FIG. 19 depicts an example of stacked package substrate having cavities for fitting dice connected through MPIF, in an embodiment of this invention.

FIG. 19 illustrates an embodiment of this invention in which multiple package substrates (e.g., 1942 and 1902) are stacked vertically and are electrically connected through mold (1914) vias (e.g., 1916 and 1920) from the lower package substrate (1902) to the upper package substrate (1942). In one embodiment, a lower package (1902) includes an antenna (1928) placed on a heat slug (1926) which is attached to the context die(s) (e.g., 1908 and 1910) exposed through a through cavity (1924) in the lower package substrate (1902). In one embodiment, the upper package substrate (1942) has a through mold via to fit part of context die(s) (e.g., 1938, 1940). The context die(s) (e.g., 1908 and 1910, 1938 and 1940) are flipped and electrically connected through MPIF (1912, 1932) to core die substrates (1900, 1930) which in turn are flipped on the package substrates (1902, 1942) over their bumps (1904, 1944), respectively. In one embodiment, the package includes other features such as heat slug (1918) and/or antenna (1922) that are connected to the upper package substrate (1942) through vias (1936 and 1940, respectively). In one embodiment, the package elements are protected by a molding/protective compound (1914) and the external electrical connection to the package is provided through the package balls (1906) attached to the lower package substrate (1902).

Figure 20:
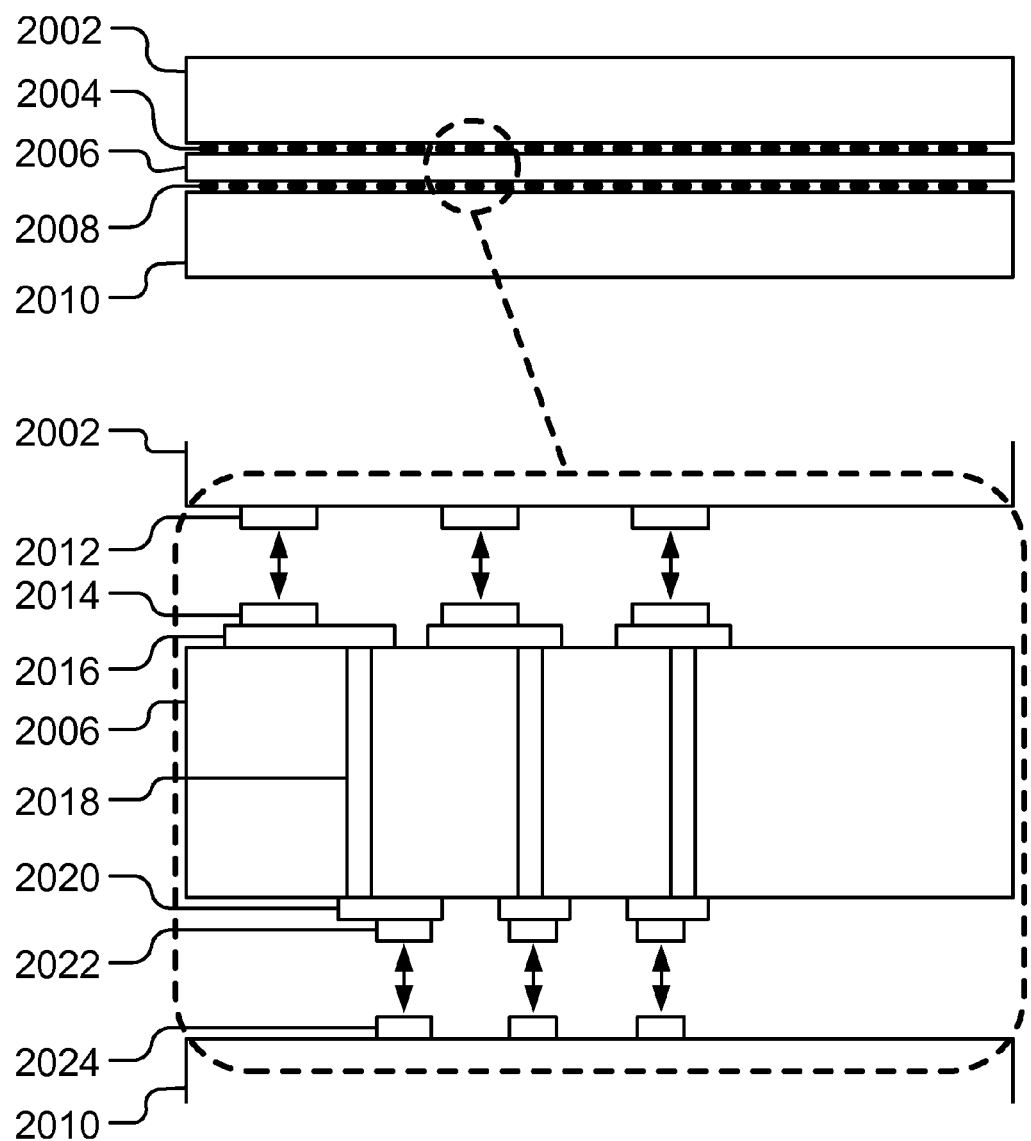
FIG. 20 illustrates an interposer layer providing electrical connection between the stacked dice using MPIF on each side, in an embodiment of this invention.

FIG. 20 illustrates an embodiment on this invention where an interposer (2006) is used to make a face to face electrical connection between two dice (2002 and 2010) via the MPIF (2004 and 2008) on the corresponding surfaces. In one embodiment, the interposer (2006) is used to match the MPIF pads (e.g., 2012) on one substrate (2002) to the MPIF pads (e.g., 2024) of the other substrate (2010) and provide the electrical connection through conducting layer(s) (e.g., 2016 and 2020) and vias (e.g., 2018) in the interposer (2006) between the matching MPIF pads (e.g., 2014 and 2022) on the contacting surfaces the interposer (2006). Various materials can be used for the interposer, such as silicon, FR-4, bismaleimide triazine (BT), and cyanate ester (CE), or polyimide. In one embodiment, the interposer contains multiple metal/conducting layers/planes and vias for routing electrical signals and/or power, on either side. In one embodiment, the connecting vias through the interposer are lined up with one set of MPIF pads on one of the surfaces, while a conducting distribution layer on the opposite surface of the interposer is used to electrically connect the vias to the set of MPIF pads on the interposer's opposite surface. In one embodiment, the interposer is used to match MPIF pads of two dice with different pad contact pitch, shape, or configuration. Interposer may have various shapes or sizes in various embodiments of this invention. Interposer may include or support other electrical components such as an antenna in various embodiments of this invention.

Figure 21:
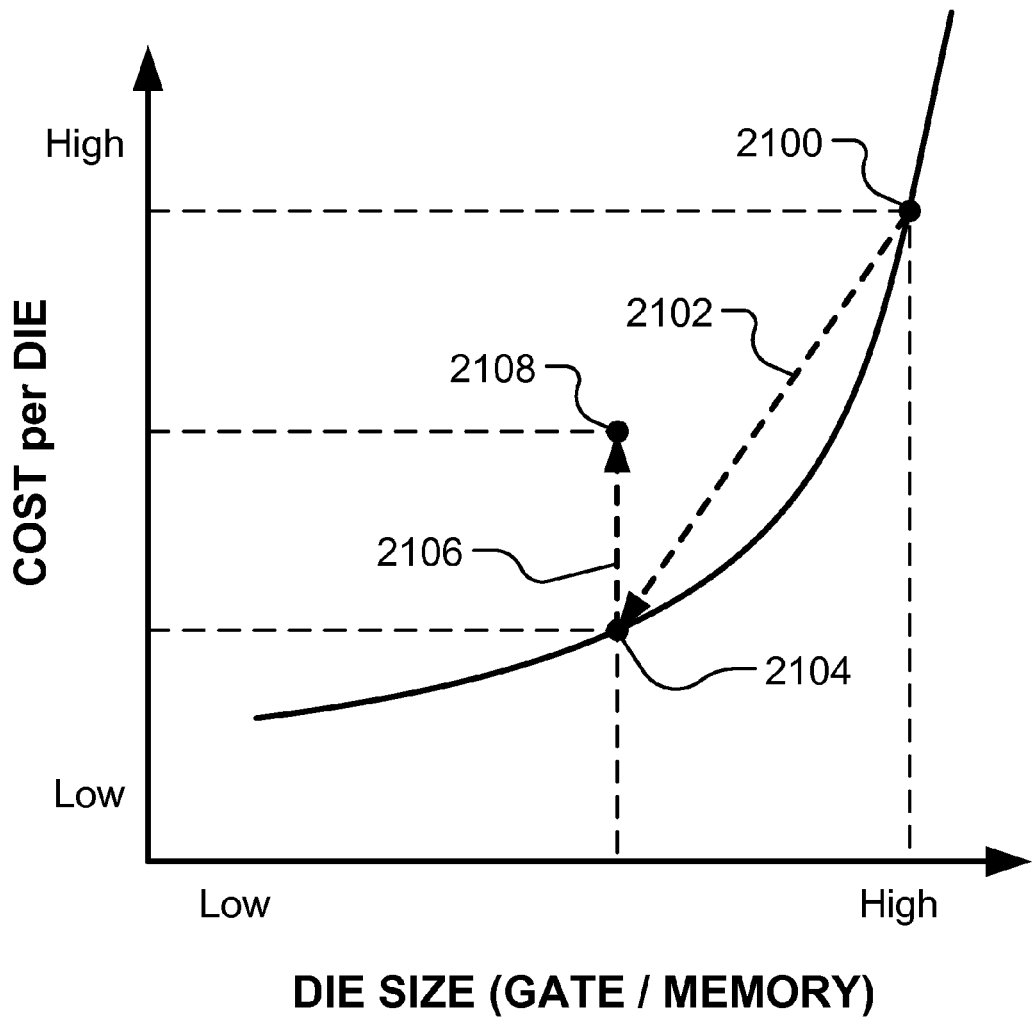
FIG. 21 qualitatively illustrates the cost and die size/gate/memory relationship and reduction of the cost due to core stacking, for an embodiment of this invention.

FIG. 21 qualitatively illustrates the cost per die versus die size (number of gates/amount of memory). One factor affecting the cost per die is the reduction in die yield due to increase in the number of gates or devices with increase in the die size. For example, compared with FPGA, an embodiment of this invention uses smaller die size as the programming interconnect switches are pushed to a context die. This is represented by the reduction of the cost (2102) from original (2100) (e.g., FPGA) to that of a core die substrate (2104). Point 2108 represents a total die cost with core staking of context die having a smaller size. In one embodiment, the increase in cost due to core stacking (2106) is still less than the reduction in cost due to die size reduction (2102). In addition, the initial development cost/effort/time is significantly reduced compared to that of structured ASIC as mentioned earlier.

Figure 22:
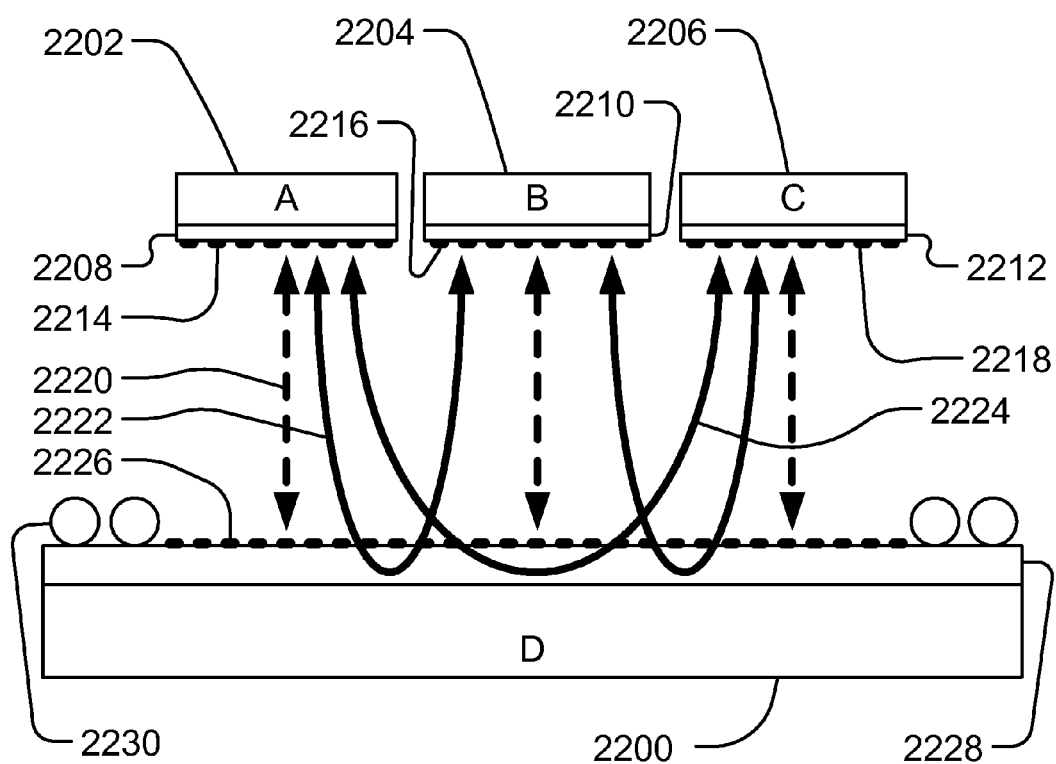
FIG. 22 illustrates CoreStack to CoreStack electrical connections, in one embodiment, through a Base-Core die substrate by flipping CoreStacks on the Base-Core die substrate.
Figure 23A:
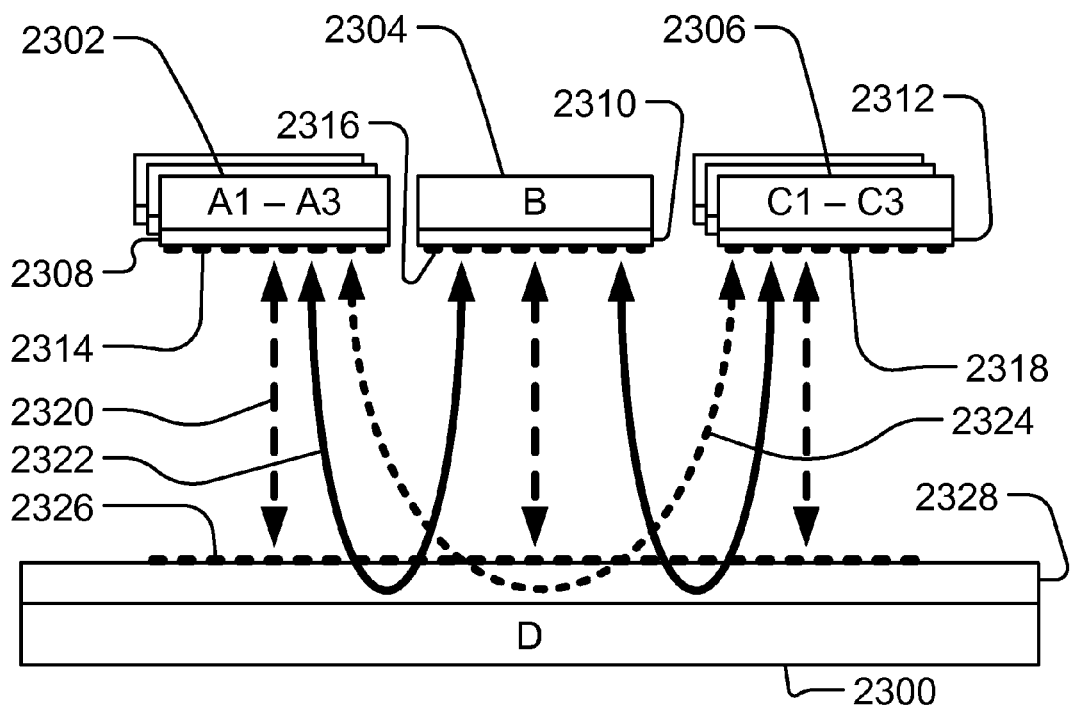
FIG. 23(a) illustrates CoreStack to CoreStack electrical connections via a CoreStack Switch, in one embodiment, through a Base-Core die substrate by flipping CoreStacks on the Base-Core die substrate.
Figure 23B:
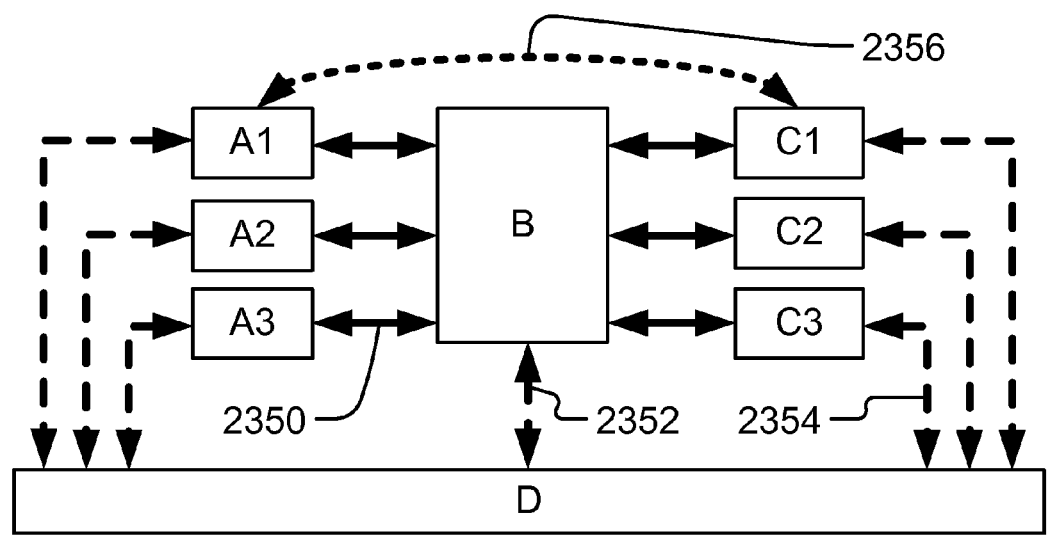
FIG. 23(b) logically illustrates the electrical paths between CoreStacks, CoreStack Switch, and Base-Core die substrate, in one embodiment.

For the purposes of FIGS. 22, 23(*a*), and 23(*b*), CoreStack is a die that is flipped (and stacked) on a core die substrate to provide electrical connections at their interface.

In one embodiment of this invention, as illustrated for example in FIG. 22, two or more CoreStacks (e.g., A (2202), B (2204), and C (2206)) are electrically connected together (as indicated by 2222 for connection between A and B, and 2224 for connection between A and C) without reaching the Base-Core's (D (2200)) transistors/gates. Such electrical connections are made via the CoreStacks' "bottom" RDL (e.g., 2208, 2210, and 2212) and CoreStacks' MPIF pads (e.g., 2214, 2216, and 2212), through MPIF pads (2226) of Base-Core (2200), and "top" RDL (2228) of Base-Core (2200). In one embodiment, additional metallization/conducting layer(s) on base-Core (2200) facilitate such electrical connections. In one embodiment, similar level of dense interconnects for face-face MPIF is provided for CoreStack-to-CoreStack connections via Core-Base's MPIF and metallization/conducting layer(s). In one embodiment, electrical connections (as indicated by dash lines, e.g., 2220) are also provided between CoreStack(s) (e.g., A, B, or C) with Base-Core (2200) through their respective MPIF pads. In one embodiment, Base-Core is bumped (2230) in order to be flipped on a package substrate (not shown).

In one embodiment of this invention, as illustrated for example in FIG. 23(*a*), one or more CoreStacks (2302) (e.g., represented by A1 to A3) are electrically connected/switched to one or more CoreStacks (2306) (e.g., represented by C1 to C3) via a CoreStack switch (2304) (represented by B). The switched connections, which are illustrated by solid lines (e.g., 2322) in FIG. 23(*a*), are made through CoreStacks' "bottom" RDLs (e.g., 2308, 2310, 2312) and CoreStacks' MPIF pads (e.g., 2314, 2316, and 2318), through Base-Core's (2300) MPIF pads (2326) and Base-Core's "top" RDL (2328). As illustrated in a logical diagram in FIG. 23(*b*), CoreStacks A1 through A3 are electrically connected (e.g., 2350) to CoreStack switch B, and CoreStacks C1 through C3 are electrically connected to CoreStack switch B (as depicted by solid arrow lines in FIG. 23(*b*)). In one embodiment, the electrical connections (as indicated by dash lines, e.g., 2320, 2354, or 2352) are also provided between CoreStack(s) (e.g., A1-A3, B, or C1-C3) with Base-Core (D)'s gates/transistors through their respective MPIF pads. In one embodiment, the MPIF pads and metallization/conducting layer(s) on Base-Core provide electrical paths (e.g., 2324, 2356) between CoreStacks (e.g., A1-A3 to C1-C3) without going through the CoreStack switch (e.g., B).

Figure 24:
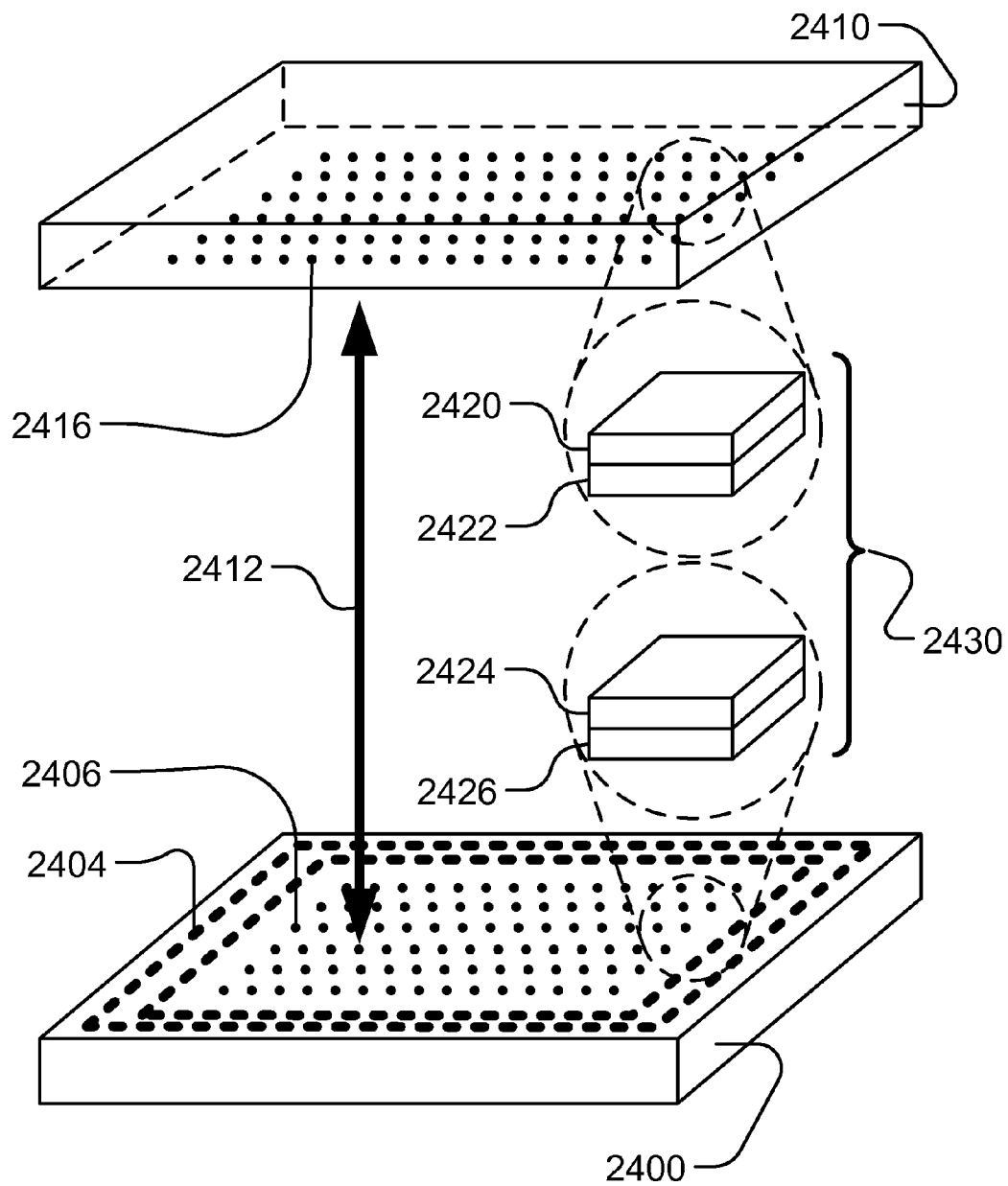
FIG. 24 illustrates a soft I/O by flipping a soft logic/context die on a core I/O template die, in one embodiment of this invention.

In one embodiment of this invention, a soft (i.e., programmable) Input/Output (I/O) is provided by leveraging the 3D gate stacking (2412) of a context/programming die (2410) on a core-base (2400) with I/O connections (e.g., I/O ring 2404), as illustrated for example in FIG. 24. In one embodiment, an I/O template (2426) is provided on the core-base (2400) that maps to various I/O basic structures such as Low-Voltage Differential Signaling (LVDS), High-Speed Transceiver Logic (HSTL), and/or Stub Series Terminated Logic (SSTL), that can be used to construct higher level I/O structures such as Double Data rate Synchronous dynamic random access memory (DDR2), Double-Data-Rate Three (DDR3), System Packet Interface (SPI4), Universal Serial Bus (USB), and/or MXS type interfaces. In one embodiment, electrical connectivity between the basic elements of the I/O structure on the I/O template "bottom" (2426) is provided via core-stacking soft logic (i.e., I/O configuration slot (2420)) through one or more metal/connectivity layer(s) and pads (2424) on the base template used for connecting to the soft-logic and one or more metal/connectivity layer(s) and pads (2422) on the soft logic, in order to form soft I/O (2430). In one embodiment, such core-stacking is provided through MPIF formed by the metallization/conducting layers and pads (e.g., 2406 or 2424, and 2416 or 2422) of the context die (2410) and the core base (2400). An embodiment provides the ability to reconfigure I/O pending the interface requirements. In one embodiment, e.g., for production, the base die (2400) is metalized (e.g., by fusing the MPIF pads (2406)) to adopt the soft I/O configuration. In one embodiment, the Soft Logic (2420) is used to configure the I/O Slot (2426). In one embodiment, e.g., for production, the metal connectivity to Soft Logic is fused to fix I/O configuration by eliminating the Soft Logic block. For an embodiment, the fusing of the MPIF pads (2406) is illustrated in FIG. 7(*b*).

For the illustration purposes, the die bumps shown as round in this disclosure; however, the bumps may have any shape or be in various sizes for the purpose of this invention.

For the illustration purposes, MPIF pads are shown as rectangular in this disclosure; however, these pads may have various shapes (e.g., round, polygon), size or pitch, or have any configuration for the purpose of this invention. For the purpose of this invention, the contact pads can be extruded, deposited or assembled or self-assembled with any processes. In one embodiment, the MPIF pads are made of carbon nanotube/fiber. In one embodiment, the MPIF pads are made of gold or copper posts electroplated or deposited and patterned.

For the illustration purposes, the context die is shown flipped on the core die substrate in this disclosure; however, the core die substrate may also be flipped over the context substrate for the purposes of this invention to form MPIF at the contacting surface.

For the illustration purposes, the MPIF pads are shown at the same side of die substrate as the main circuits on the die, in this disclosure; however, other embodiments where the main circuit on the die is on its opposite side (e.g., with connection paths to the MPIF pads through substrate vias) are also included in this invention. In such an embodiment, to form MPIF, the flip-chip is done on the MPIF pad side.

For the illustration purposes, few context dice are shown attached to a core die substrate in this disclosure through MPIF; however, any number of dice assembled in any configuration is included in this invention.

For the illustration purposes, an embodiment is specified with 10k to millions of MPIF pads per $cm^2$; for example, an embodiment with number of MPIF pads in range of 10,000 to 100,000,000 is included in this invention. However, other embodiments having number of pads of about hundreds or thousands are also included in this invention. For example, an embodiment with number of MPIF pads of at least 4000 is included in this invention.

Any die assembly process is in scope of this invention, e.g., wafer-wafer bonding (which can be metal to metal, or any alloy combination of material), through-die-via (with die being any material such as Si, SiGe, GaAs, InP, and SiC), wirebond, flip-chip, or any combination of above.

For the purpose of this invention, between (or in contact with) any component(s) (e.g., dice or interposers), any material(s) (e.g., polymer, molding or adhesive) may be used for the purpose of reduction of stress, cracks, warpage, or delamination or to enhance reliability or thermal dissipation (e.g., with spatially isotropic or anisotropic conductive materials).

For the purpose of this invention: Any molding/protective compounds of any shape, size, or materials can be used; the mold(s) can contain cavity/cavities of any sizes/shapes; the mold(s) or protective compounds can be multi-layer materials of any forms/shapes or can contain conductive paths (e.g., vias, filled/hollow coppers blocks); the mold(s) can contain planes; or the mold(s) can be used as substrate, for example, for routing purposes or making connections.

In an embodiment of this invention, through mold via(s) is used, for example, for the purpose of stacking other components on the top of the base package or provide a means of connection. Various embodiments of this invention use through mold via(s) of various forms or shapes.

For the purpose of this invention: An antenna of any forms/shapes can be mounted or integrated any place on/in the package(s) (e.g., on the top/bottom/edge of the molding compounds, top/bottom/edge of the package substrate) and connected to the package using a conductive path. For example, in one embodiment, an antenna mounted on the mold is connected through mold via(s).

For the purpose of this invention: any number of components/packages can be stacked vertically/horizontally; package substrates can have cavity of any forms or shapes; heat slug or other materials of any forms or shapes can be integrated any place on the package/packages (e.g., on the top molding compound) for thermal dissipation and thermal management purposes, e.g., through mold(s) via(s).

For the purpose of this invention, passive components (e.g., capacitors, inductors, and resistors) of any forms/shapes/materials may be mounted or integrated in the package/packages.

For the purpose of this invention: package(s) may have cavity(s) of any forms or shapes; the cavity(s) may be of any depth or cut all the way through the substrate; a heat slug/heat-spreader (e.g., made of copper or other materials), an antenna, or other components (e.g., passive components) may be mounted or integrated on the cavity, e.g., at the base of the cavity (on the Ball Grid Array (BGA) side) or anywhere on/in the package substrate; or the spreader may be grounded by any means (e.g., using via(s)).

In one embodiment, a heat slug/heat spreader material block is used as an antenna. In one embodiment, such antenna is patterned or as one solid piece. For the purpose of this invention: the heat spreader may be constructed by means (e.g., blocks of any size/shapes, or from a collection of individual spreaders); the heat slug(s) or antenna(s) may be stacked on the top of each other; via(s) or other conducting materials/paths may be used to connect the slugs/antennas to the substrates/devices; or heat spreader may be embedded within the molding compound.

In one embodiment, a low temperature, high density wafer to wafer connection is used to form the MPIF. In one embodiment, a non-reflowable material(s) (e.g., copper) is used at the base of MPIF pad with a reflowable material (e.g., solder) as a capping material for the pad. In one embodiment, after aligning the dice (or a die and an interposer) to be contacted at their MPIF pads, heat and/or compression is applied to enhance the contact reliability. In one embodiment, the dice are locked in place before forming the contacts between the pads, e.g., by using vacuum holds or a molding material. In one embodiment, molding material is applied to the dice after forming MPIF pad connections between the dice to enhance the reliability of the contacts. Other embodiments of this invention use various means to form electrical contacts between the MPIF pads of the dice.

In an embodiment of this invention, instead of bumping and flipping a core die substrate on a package substrate, as shown for example on FIGS. 2, 7(*a*), (*b*), 9(*a*)-(*c*), 11, 12, and 16-19, the core die substrate is flipped and electrically connected to the package substrate through MPIF patterns (not shown). In an embodiment, a cavity in package substrate, for example as shown in FIG. 16-19 accommodates/fits the context IC(s) already flipped on the core die substrate, so that the context IC(s) does not prevent MPIF connections between the core die substrate and the package substrate.

In one embodiment, the context die, the core die substrate, or the package substrate comprises organic semiconductor devices, layers, or components. In one embodiment, interposer comprises of organic semiconductor devices, layers, or components.

Any variations of the above teaching are also intended to be covered by this patent application.

The invention claimed is:

1. A semiconductor device with multiple die assembly comprising:
   a programmable semiconductor die substrate;
   a context die substrate;
   said programmable semiconductor die substrate comprises multiple logic blocks;
   said context die substrate is flipped on said programmable semiconductor die substrate;
   said multiple logic blocks of said programmable semiconductor die substrate are electrically connected at transistor level or logic gate level, with wirebondless and bumpless electrical connections, via said context die substrate, through pads of a multiple parallel interconnect fabric;
   said context die substrate implements a custom application of said semiconductor device by using said multiple logic blocks via electrical connections through pads of said multiple parallel interconnect fabric to said multiple logic blocks;
   a programming interface;
   wherein said programming interface is located on opposite surface from flipped surface of said context die substrate, so that after connection, said context die substrate is programmed through said programming interface;
   wherein said context die substrate comprises programmable switches that electrically connect pads on said context die substrate, causing electrical connection between gates and transistors, in logic blocks, on said programmable semiconductor die substrate;
   wherein said programmable semiconductor die substrate comprises a platform fabric input-output;
   wherein said platform fabric input-output provides input and output for specific purpose function of serializer and deserializer functional blocks, to convert data between serial data and parallel interfaces in each direction for communications;
   a memory management circuit for said programmable semiconductor die substrate;
   a memory module;
   wherein said memory management circuit is connected to said memory module.

2. The semiconductor device with multiple die assembly as recited in claim 1, comprising a non-reflowable material.

3. The semiconductor device with multiple die assembly as recited in claim 1, comprising copper or gold.

4. The semiconductor device with multiple die assembly as recited in claim 1, comprising a reflowable material.

5. The semiconductor device with multiple die assembly as recited in claim 1, comprising solder material.

6. The semiconductor device with multiple die assembly as recited in claim 1, comprising capping material.

7. The semiconductor device with multiple die assembly as recited in claim 1, comprising interposer.

8. The semiconductor device with multiple die assembly as recited in claim 1, further comprising a customizable interconnect switch.

9. The semiconductor device with multiple die assembly as recited in claim 8, wherein said customizable interconnect switch is a MUX.

10. The semiconductor device with multiple die assembly as recited in claim 1, further comprising a field programmable interconnect switch.

11. The semiconductor device with multiple die assembly as recited in claim 10, wherein said field programmable interconnect switch is reprogrammable.

12. The semiconductor device with multiple die assembly as recited in claim 10, wherein said field programmable interconnect switch is fuse-based.

13. The semiconductor device with multiple die assembly as recited in claim 10, wherein said field programmable interconnect switch is not reprogrammable.

14. The semiconductor device with multiple die assembly as recited in claim 1, comprising heat spreader.

15. The semiconductor device with multiple die assembly as recited in claim 1, comprising metallization or conducting layers.

16. The semiconductor device with multiple die assembly as recited in claim 1, comprising dielectric layers.

17. The semiconductor device with multiple die assembly as recited in claim 1, further comprising subcomponents.

18. The semiconductor device with multiple die assembly as recited in claim 17, wherein said subcomponents are stacked together vertically or horizontally.

* * * * *